United States Patent

Nakagawa et al.

[11] Patent Number: 5,986,592
[45] Date of Patent: Nov. 16, 1999

[54] ENCODER DECODER DEVICE NOT USING AN A/D CONVERTER AND METHOD THEREOF

[75] Inventors: Toshiyuki Nakagawa, Kanagawa; Shunji Yoshimura, Tokyo, both of Japan

[73] Assignee: Sony Corporation, Tokyo, Japan

[21] Appl. No.: 08/940,828

[22] Filed: Sep. 30, 1997

[30] Foreign Application Priority Data

Oct. 1, 1996 [JP] Japan .................................. 8-260667

[51] Int. Cl.⁶ .................................................. H03M 13/00
[52] U.S. Cl. ............................... 341/94; 369/50; 360/48
[58] Field of Search ................................ 341/94, 58, 59; 360/51, 40, 48; 369/59, 60, 44.32, 44.38

[56] References Cited

U.S. PATENT DOCUMENTS

| | | | |
|---|---|---|---|
| 4,713,802 | 12/1987 | Kobata et al. | 369/59 |
| 5,216,677 | 6/1993 | Takagi et al. | 371/40 |
| 5,572,496 | 11/1996 | Hayashi et al. | 369/59 |
| 5,701,310 | 12/1997 | Deguchi et al. | 371/30 |
| 5,719,847 | 2/1998 | Tayeishi et al. | 369/24 |
| 5,771,127 | 6/1998 | Reed et al. | 360/51 |

*Primary Examiner*—Brian Young
*Assistant Examiner*—Peguy JeanPierre
*Attorney, Agent, or Firm*—Frommer Lawrence & Haug, LLP.; William S. Frommer

[57] ABSTRACT

An encoder/decoder device for improving the bit error rate, speedily and at low cost without using an A/D converter circuit. A comparator compares the playback signal loaded from the disk with a specified reference level, places the signal in binary notation and sends the binary information to a memory. When the continuous length showing the quantity of zeroes placed between ones in succession is an error length which is shorter than a specified length 3T designated beforehand, an error length detection circuit detects this as a continuous length. A pattern detector circuit detects patterns in which the continuous length in front of error length 2T is 3T and the continuous length behind 2T is 4T or more, and further detects patterns in which the next continuous length after error length 2T is 3T and the continuous length in front of 2T is 4T or more. A position compensator circuit specifies the bit right after 2T as the correction position when a pattern greater than 3T–2T–4T is detected; and specifies the bit right before 2T when a pattern greater than 4T–2T–3T is detected. A processing circuit inverts the logic of the bits specified for position correction and outputs the result.

20 Claims, 24 Drawing Sheets

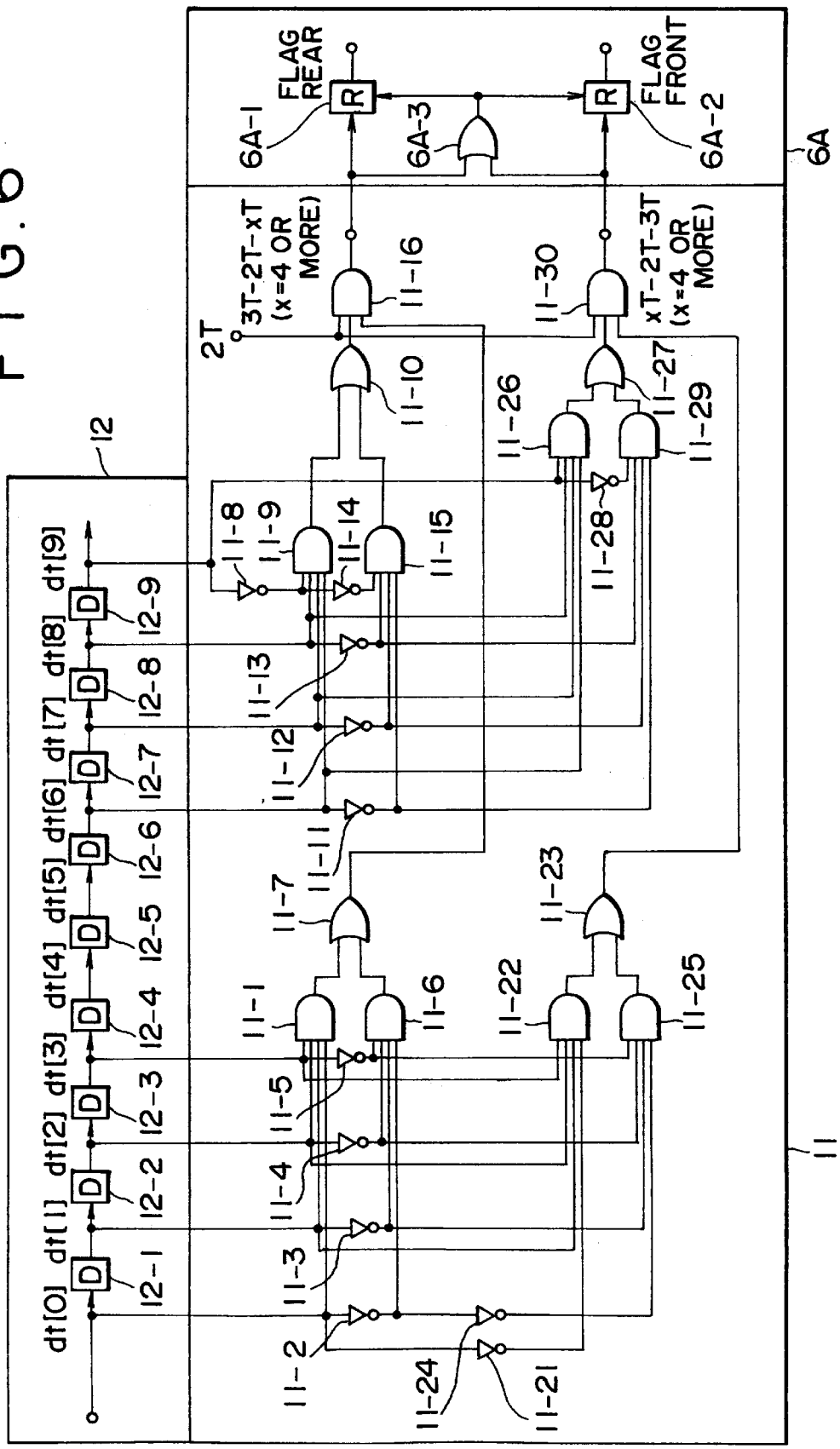
F I G. 6

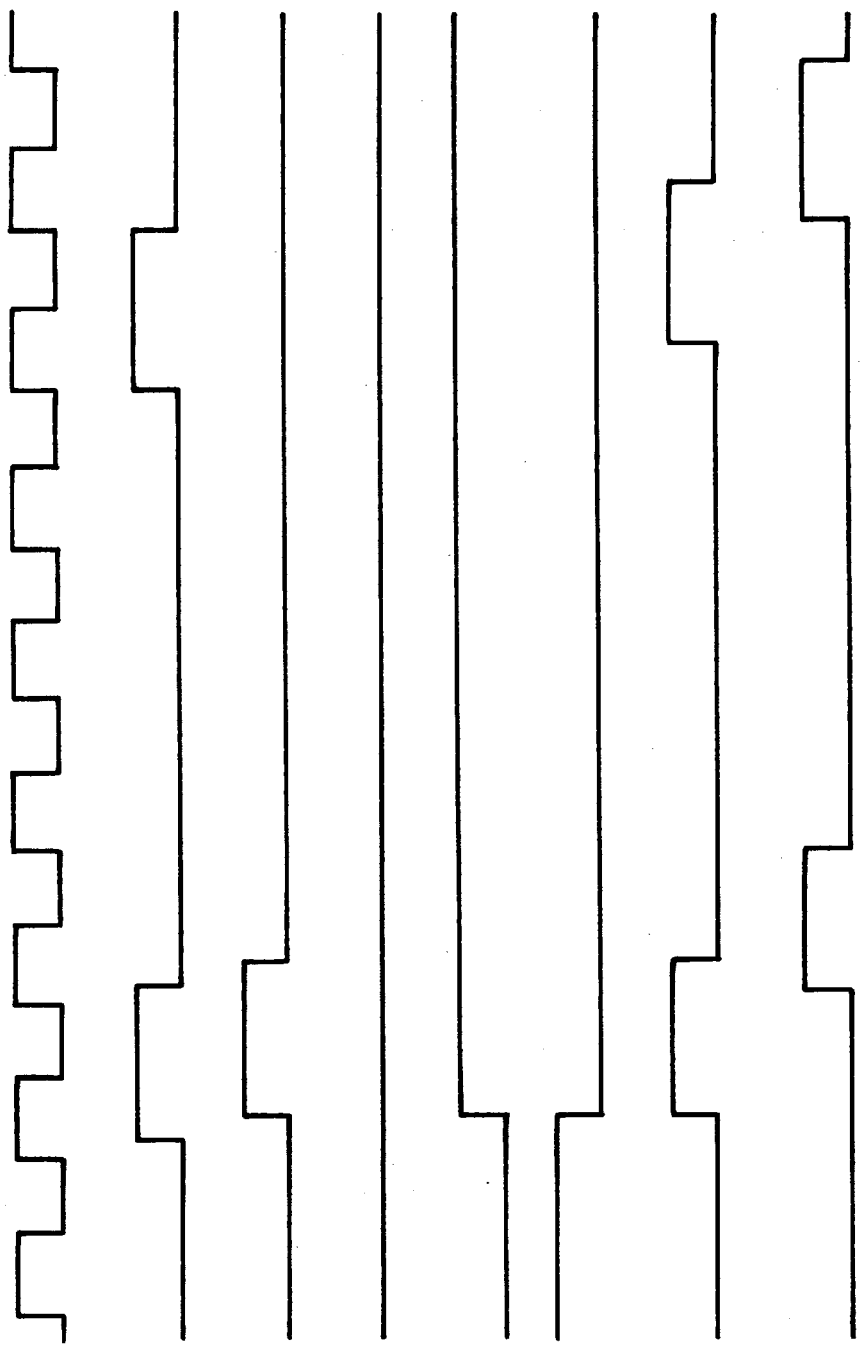

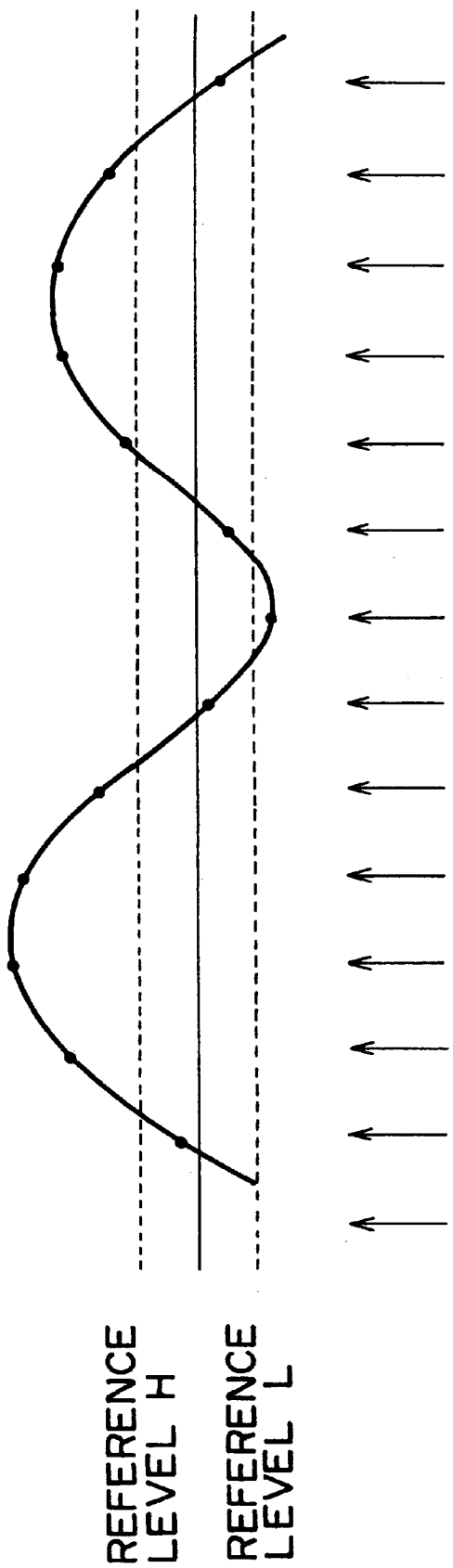

ENCODER DECODER DEVICE NOT USING AN A/D CONVERTER AND METHOD THEREOF

BACKGROUND OF THE INVENTION

The present invention relates in general to an encoding and decoding device and method for playing an RF signal loaded from a record medium on which is recorded information utilizing an RLL (Run Length Limited) code, decoding this signal based on at least one reference level and issuing channel bit data, and in particular relates to an encoding and decoding device and method for selecting bits with a high error probability based on appended information when locations exist in the channel bit data where the conditions for identical minimum continuous length or maximum continuous length symbols are not satisfied, correcting the selected bit and issuing channel bit data satisfying the conditions for identical minimum continuous length or maximum continuous length symbols.

When sending data to a specified path, for instance when recording on a record medium such as magnetic disks, optical disks, or optical magnetic disks, the data is modulated to match the transmission and record media. One such modulation method is known as block encoding. In block encoding, blocks are formed in units composed of data strings of m×i bits (hereafter called data terms) and these data terms are converted into coded terms composed of n×i bits in compliance with applicable encoding rules. These block codes are fixed length codes when i=1 and when more than one element is chosen for i, in other words when i=2 or more, the maximum i when i max=r is a variable length code. These block encoded symbols are shown as variable length symbols (d, k; m, n; r). Here i is the bound length and r is the maximum bound length. Also, the symbols d and k are a symbol "1" and the other symbol being "0" placed consecutively between the "1" and "1" symbols and representing respectively the minimum continuous quantity and maximum continuous quantity in the code train.

As a specific example, the modulation system for the compact disc (CD) is explained next. The compact disc uses Eight to Fourteen Modulation or (EFM). In this modulation system, an eight bit data term is pattern-converted into a 14 bit code term (channel bit) after which a 3 bit machine bit is added in order to reduce the DC components resulting from EFM modulation, the result is recorded on an NRZI modulated disc. In this case, 8 bits are converted to 14 bits and machine bits are also added to satisfy the condition that the minimum continuous quantity (specified length) is 2 for the "0" (zeroes) between the consecutive "1" and "1" within the code train and the maximum continuous quantity (specified length) for "0" is 10. The parameters for the variable length codes (d, k; m, n; r) due to this EFM modulation are (2, 10; 8, 17; 1). When an interval T is set for the channel bit string (record waveform) interval, the minimum inversion interval T min (specified length) is 3 (=2+1) T. Further, the maximum inversion interval T max (specified length) is 11 (=10+1) T. Also, when T data is set as the data interval for the data string, the detection window width Tw is expressed as (m/n)×T data, The value for Tw becomes 0.47 (=8/17) T data.

Also, after NRZI modulation for EFM modulated record, the identical symbol d' for minimum continuous length is 3 (=d+1=2+1) and the identical symbol for maximum continuous length k' after NRZI modulation is 11 (=k+1=10+1).

If the bits are shrunk in the compact disk in the direction of linear velocity, the recording density can be increased. The length of the minimum bit corresponding to the minimum inversion interval T min will become smaller. However bit detection becomes difficult when the minimum bit becomes too much smaller than the spot size of the laser beam causing errors to occur.

The error rate becomes even worse when skew occurs on the disk playback surface. Disk skew is a tilting of the laser beam axis versus the disk and is grouped into tangential skew within the surface parallel to disk motion, and radial skew perpendicular to the disk surface. Among these two types of skew, in tangential skew the adverse effects on error rate occur comparatively quickly. Therefore this type of skew is a factor in reducing the allowable error rate margin in the system design.

On investigating the error distribution for identical symbol continuous length, it was found that errors causing tangential skew mainly occurred when the identical symbol continuous length was short. In other words, it was found the error rate worsened because the T min (d') length was decoded into the T min−1 (d'−1) length. For instance, when skew occurred in the tangential direction in the EMF modulation system, and the bit interval of the record waveform is set to T, many errors will occur because the minimum inversion interval T min which is 3T (specified length) is decoded as the even shorter interval 2T (in violation of specified length).

In optical disks on the other hand, a certain margin for an asymmetric disk is allowed for in the manufacture however a playback waveform that deviated asymmetrically up and down versus the center level must be taken into account.

In the conventional art, the Viterbi decode method is known as a method for compensating with signal processing for poor error rates. In the Viterbi decode method, encoding errors are reduced, the path that is shortest geometrical distance searched and the most likely value by discarding poor probability path in what amounts to a simplified decoding method. The Viterbi decode method also allows adding an algorithm for correcting the minimum inversion interval T min.

However, the Viterbi decode method has the drawback of requiring a complex circuit making the required hardware of a larger scale. Further, the asymmetry must be eliminated in order to decode with this method. In optical disks the system allowing for a certain asymmetry makes optimization of this asymmetry necessary making this circuit even more complicated. Upon which this applicant proposed for instance in Tokugan-Hei 8-22530, a Run-Detector method as a method using a simpler circuit for performing correction by signal processing of bad error rates.

A block diagram showing the encoding/decoding device for this proposal is shown in FIG. 24. The waveform equalizer1 in FIG. 24 forms an analog signal waveform from the signal that was input. The PLL circuit 2 generates a bit clock pulse based on the analog waveform formed by the equalizer1. An A/D converter 3 changes the analog signal into the specified digital signal. This A/D converted digital data is then converted to a 1 or 0 bit string (binary data) based on the center level (zero) by the comparator 4.

The error length detection 5 an interval as an error length if this interval is shorter than minimum interval T min which is the specified length. For instance, if the EFM modulation code symbols (d, k) are used, when the record waveform bit interval is set as T, a T min of 3T (specified length) which was mistakenly converted to 2T (error length) as a bit string of binary data will be detected by the detector 5. Next, based on the position where the error length was detected, the position correction detector 6 corrects the bit immediately prior to or immediately after the error bit string matching the error length. In other words, the size of the signal level output from the A/D converter 3 for the bit immediately prior to or immediately after the error bit string having the error length 2T is compared and a bit with a signal size near zero level is specified as the error bit correction position. The correction processor 7 corrects the bit specified in the channel bit string as the correction position and then outputs this channel bit string data after correction is complete.

However in the method proposed as shown in FIG. 24, correction is performed by installing an A/D converter circuit in the equipment and utilizing the playback signal level (information on direction of amplitude). Therefore in systems where an A/D converter circuit is basically unnecessary an A/D converter circuit must be installed for error correction, thus having drawbacks such as making the circuit configuration more complex and increasing the cost. In view of the above problems, this invention will provide signal processing of the signal containing the bad error rate in a device with a simple configuration not requiring addition of an A/D converter.

SUMMARY OF THE INVENTION

The encoding and decoding device of claim 1 is characterized by an error length detection means for detecting an error length of the identical symbol for continuous length of the transmit code not corresponding to the specified length, a pattern detection means for detecting the transmit code bit string pattern containing the error bit string comprised of the error length symbol, a specifier means to specify the transmit code correction position containing the error bit string that corresponds to the detection output of the pattern detection means, and a correction means to correct the position of the transmit code bit specified by the specifier means so that the error length matches the specified length.

The encoding and decoding method of claim 20 is characterized by an error detection step for detecting an error length of the identical symbol for continuous length of the transmit code not corresponding to the specified length, a pattern detection step for detecting the transmit code bit string pattern containing the error bit string comprised of the error length symbol, a specifier step to specify the transmit code correction position containing the error bit string that corresponds to the detection results of the pattern detection step, and a correction step to correct the position of the transmit code bit specified by the specifier step so that the error length matches the specified length.

In the encoding and decoding device of claim 1 and the encoding and decoding method of claim 20 when the identical symbol for continuous length of the transmit code not corresponding to the specified length is detected, correction of the specified bit position is performed so that the error length matches the specified length. This position correction is specified to correspond to the bit string pattern.

BRIEF DESCRIPTION OF THE DRAWINGS

FIG. 6 is a block diagram showing of the pattern detector and memory of FIG. 1.

FIGS. 8A through 8H are timing charts illustrating the operation in FIG. 7.

FIG. 15 is graph showing operation of the comparator in FIG. 1.

DETAILED DESCRIPTION OF THE PREFERRED EMBODIMENTS

The embodiment of this invention will be explained next while referring to the accompanying drawings. An optical disk was utilized as the recording medium.

As record code symbols the minimum continuous quantity (specified length) d is 2 for the "0" (zeroes) between the consecutive "1" and "1" and also, the maximum continuous quantity (specified length) k is 10 for the "0" (zeroes) between the consecutive "1" and "1". These record symbols (d, k) are utilized on binary level. The embodiment of this invention is explained by using as an example, equipment to playback an NRZI modulated channel bit data string, from an optical disk on which the binary level (d, k) is recorded by NRZI modulation. Here, the record code symbols (d,) are codes expressing the edge while the channel bit string after NRZI modulation are code symbols expressing a level equivalent to the bit. Also, after NRZI modulation, the identical symbol d' for minimum continuous length (specified length) is 3 (=d+1=2+1) and the identical symbol for maximum continuous length (specified length) k' after NRZI modulation is 11 (=k+1=10+1).

Figure 1:
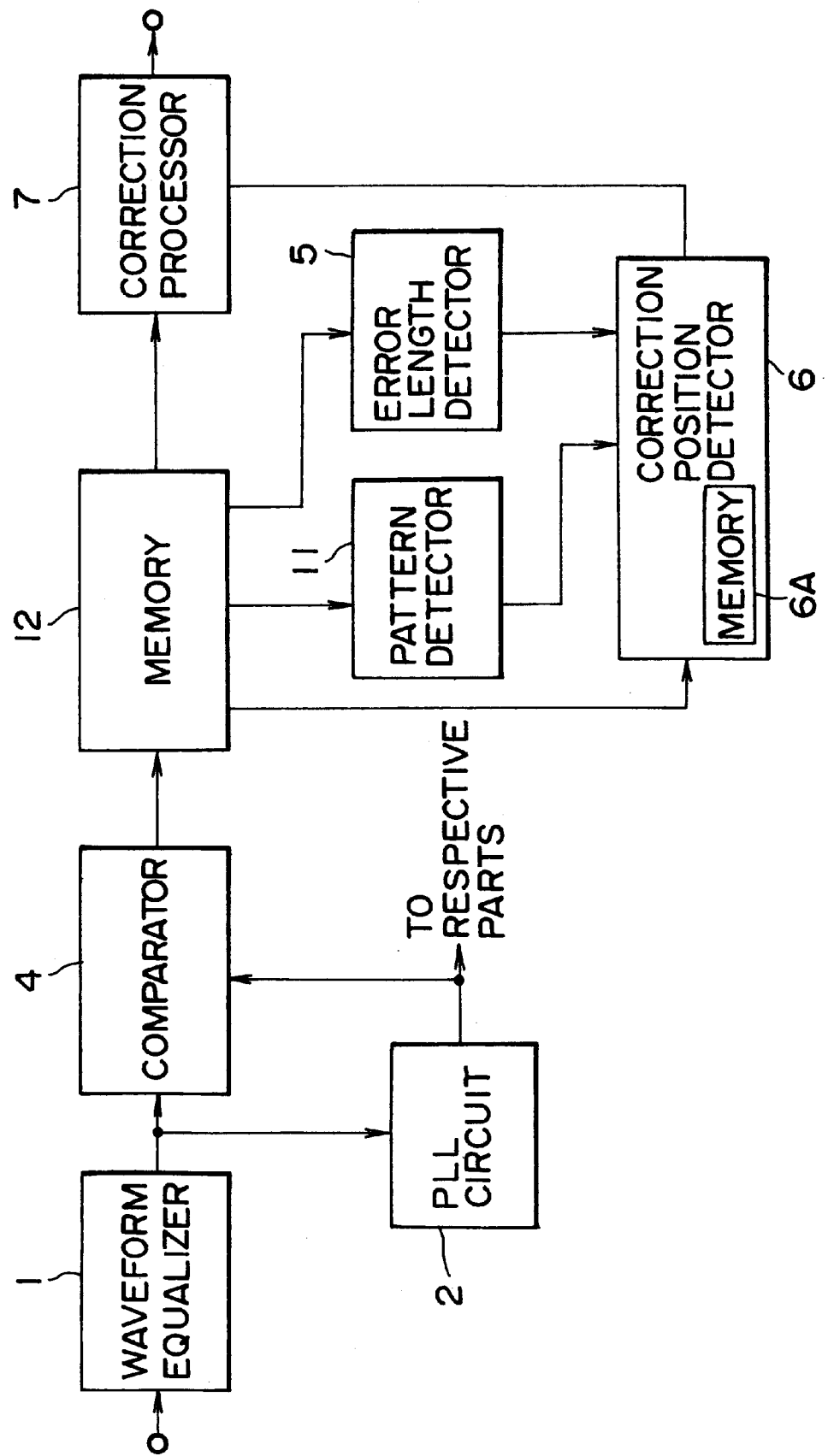
FIG. 1 is a block diagram showing the encoding and decoding device of this invention.

FIG. 1 is a block diagram showing the structure of the encoding and decoding device of this invention. In the waveform equalizer circuit 1 in FIG. 1, after NRZI modulation of the minimum continuous length d for zeros placed consecutively between "1" and "1" inside the code chain, the record code which is identical symbols for minimal continuous length d' (=d+1 (d≧1)) are loaded from the optical disk (recording medium) not shown in the drawing and input as an RF playback signal. After the waveform equalizer circuit 1 performs waveform equalization of the RF signal that was input, this output is sent to the PLL circuit 2 and the comparator 4. The PLL circuit 2 generates a bit clock pulse from the RF signal upon which waveform equalization was performed and sends the output to the comparator 4 and other sections. The comparator 4 (comparison means) compares the RF signal on which waveform equalization was performed by the waveform equalizer circuit 1 and corresponding to the bit clock pulse input from the PLL circuit, with a specified reference level. When the RF signal level is greater than the specified reference level a logic level 1 is issued and when lower than the specified reference level a logic level 0 is issued (as binary data) as a decoding result.

The binary data from the comparator 4 is supplied to the memory 12 by means of a plurality of longitudinally connected registers (related later while referring to FIG. 5 and stored. Data loaded from the memory 12 is supplied to a correction processor 7, an error detector 5, a pattern detector 11, and a correction position detector 6. The error detector 5 (error detection means) detects error lengths 2T and 1T (error bit string) when present in data loaded from the memory 12 and sends a detection signal to the correction position detector 6. The pattern detector 11 (pattern detection means) detects binary data patterns loaded from the memory 12 and outputs a flag corresponding to the detection data to the correction position detector 6.

The pattern detector 11 detects patterns when the bit interval in the channel bit string is T and patterns of (3T−2T−xT) or (xT−2T−3T) (x≧4) are present in the binary data loaded from the memory 12. In other words, a flag is issued specifying a bit string as a correction bit string; when a bit string having continuous length 3T prior to the bit string having consecutive length 2T (error length) is present, and when consecutive length xT is present subsequent to 2T and 3T, or a flag is issued specifying a bit string as a correction bit string; when a bit string having continuous length xT prior to the bit string having consecutive length 2T (error length) is present, and when consecutive length 3T is present, after 2T and xT.

The correction position detector 6 (specifier means) which also internally contains the memory 6a is supplied by outputs from the error detector 5 and the pattern detector 11. The correction position detector 6 generates a signal (correction position data) corresponding to the correction position of the binary bit data loaded from the memory 12 and outputs this to the correction processor 7. The correction processor 7 (correction means) corrects the bit of the correction position specified by the correction position detector 6 from among the binary data loaded from the memory 12 and outputs this correction data in synchronization with the channel clocks.

Next this operation will be described while referring to the flowchart in FIG. 2 and the timing charts in FIGS. 3A through 3J and FIGS. 4A through 4J.

First of all instep S1 a judgement is made as to whether or not data input has ended. If data input has not ended then operation proceeds to step S2 where data loading and comparator processing is implemented. In other words, the waveform equalizer circuit 1 is input with the RF signal played from the optical disk not shown in the drawing and after waveform shaping is performed, the output is sent to the comparator 4 and the PLL circuit 2. The PLL circuit 2 generates a channel clock (FIG. 3B) synchronized with the RF signal (FIG. 3A) input from the waveform equalizer 1 and outputs this to the comparator 4. The comparator 4, in synchronization with the channel clocks, compares the RF playback signal (3A) supplied from the waveform equalizer circuit 1 with a specific reference level R (for instance zero level) and outputs a logic 1 level when the RF signal level is larger than the reference level and outputs a logic level 0 when the RF signal level is smaller than the reference level (FIG. 3C).

Next, operation proceeds to step S3 where data storage is implemented. In other words, the output from the comparator 4 (FIG. 3C) is sent to the memory 12 capable of retaining at least 10 channel clocks worth of data, and stored.

Operation then proceeds to step S4 where a decision is made as to whether or not the continuous length of 2T (error length) is present in the bit string stored in the memory 12. In other words, the error detector 5 loads the data stored in the memory 12 and decides if the error length 2T is present or not. When the error length 2T (FIG. 3G) is detected, the error detector 5 sends a detection signal to the correction position detector 6.

In the present case since the minimum continuous length is defined as 3T (specified value), the 2T continuous length which is smaller, is an error length that does not meet this standard. Essentially data with this kind of error length is not supposed to exist so that an error bit string containing such an error length indicates an error has occurred. In processing to correct such errors, the bit for correction is specified in steps S5 through S9.

When the error length 2T is detected in Step S4, operation proceeds to step S5 in which the pattern detector 11 determines whether or not a 3T−2T−xT (x≧4) pattern is present. In other words, determines if patterns are present, with a continuous length 3T prior (timewise) to the error bit string having error length 2T (detected by the error detector 5) or a continuous length 4T behind 4T.

Figure 3:
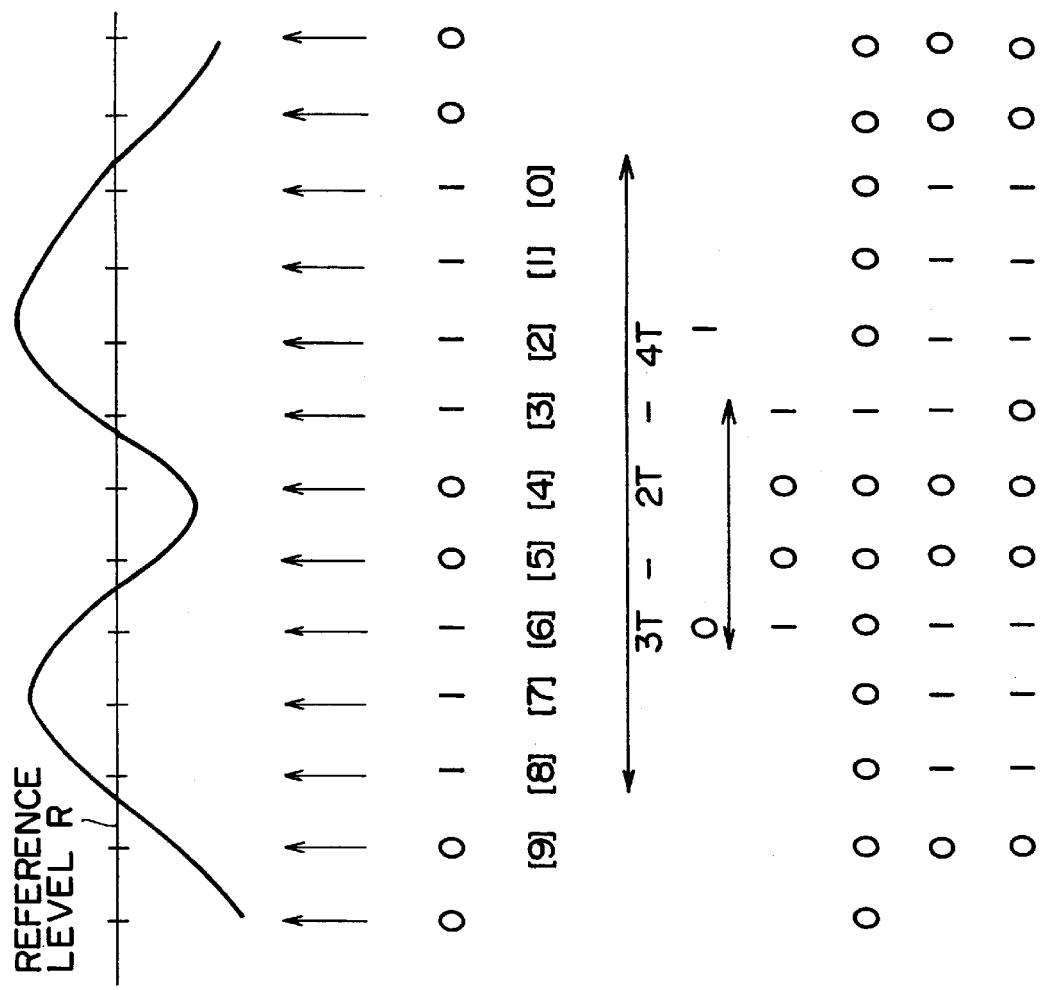
FIGS. 3A through 3J are timing charts illustrating the operation of the embodiment of this invention.

In the case of FIG. 3, the code for continuous length pattern is 3T−2T−4T so this is detected by the pattern detector 11 (FIG. 3E). At this point the operation proceeds to step S6 and the pattern detector 11 sends a flag (FIG. 3F) to the correction position detector 6 that corresponds to the bit string (bit string having continuous length 4T) behind the error bit. Restated, the bit string immediately behind the error bit string is specified with a flag and sent to the correction position detector 6.

In step S5 however, when the pattern detector 11 does not detect the 3T−2T−xT (x≧4) pattern, the operation proceeds to Step S7 where pattern detector 11 determines whether or not xT (x≧4)−2T−3T is present or not. When the pattern detector 11 detects that a bit string with a continuous length of 4T or more is present before (timewise) the error bit string having error length 2T (discovered by error length detector 5) and detects a bit string with a continuous length 3T behind the error bit string, a flag is sent in Step S8 to the correction position detector 6 corresponding to the bit string (bit string having continuous length xT) prior to the error bit.

The pattern detector 11 is set to detect the patterns 3T–2T–xT and xT–2T–3T because these are error patterns most often occurring during tangential skew.

When a flag is set in Step S6 or S8, the correction position detector 6 loads the bit string data stored in the memory 12 and generates correction data (FIG. 3H) expressing the "1" of the correction position matching nearest the error bit string from among the bit strings corresponding to the flag and send the output to the correction processor 7. In other words, when the bit string behind the error bit string is specified as the correction bit string as shown in FIG. 3, then the first bit (bit right behind error bit) of that bit string is specified as the correction position (FIG. 3H). In contrast, when the bit string prior to the error bit is specified as the correction bit string, the final bit (bit right before the error bit string) of that bit string is specified as the correction position. When a flag is generated this way in Steps S6 or S8, operation proceeds to Step S10 and the error length 2T detected by in Step S4 by error detector 5, is corrected into the specified length 3T in the correction processor 7. In other words, the correction processor 7 processes the exclusive logic sums of the correction position data (FIG. 3H) supplied from the correction position detector 6 and the data (FIG. 3I) loaded from the memory 12 and sets these processing results (FIG. 3J) as post-correction data. When the correction position data is a logic 0, the data loaded from the memory 12 is used unchanged (not corrected). However, when the logic level is 1, the data loaded from the memory 12 is inverted. In the example in FIG. 3, the first bit from among the continuous length bit string 4T right after the error bit string 2T is inverted from logic 1 to logic 0, Accordingly, the pattern 3T–2T–4T is corrected into the pattern 3T–3T–3T.

After correction processing of Step S10 is performed, operation proceeds to Step S11 in which the correction processor 6 stores the flag supplied from the pattern detector 11 into the memory 6A. When an error length is detected by the error length detector 5, and a flag has not been supplied by from the pattern detector 11, the correction processor 6 generates correction position data for the flag stored in the memory 6A (flag for prior to error length detection) and sends the output to the correction processor 7.

In other words, when the error length 2T is detected in Step S4 but the 3T–2T–xT pattern is not detected in Step S5 and also it is determined in Step S7 that the xT–2T3T pattern cannot be detected, then the pattern detector 11 does not issue a flag. Operation at this point then proceeds to Step S9 where the correction processor 6 generates correction position data for the flag stored inside the memory 6A. For instance, when the immediately prior flag is specifies the rear bit string as the correction bit string, the flag specifying the rearward bit as the correction bit string generates correction position data for an input. Also, when this flag specifies the bit string prior to the error bit string as the correction bit string, the flag generates data for this forward (front) bit string as the correction bit string. The correction position data for this flag is then sent from the correction position detector 6 to the correction processor 7.

The correction processor 7 then performs correction processing in Step S10 of this correction position data. In Step S11 the flag used in Step S9 is again stored in the memory 6A.

The preset flag can also be set for a constant output in Step S9.

Figure 4:
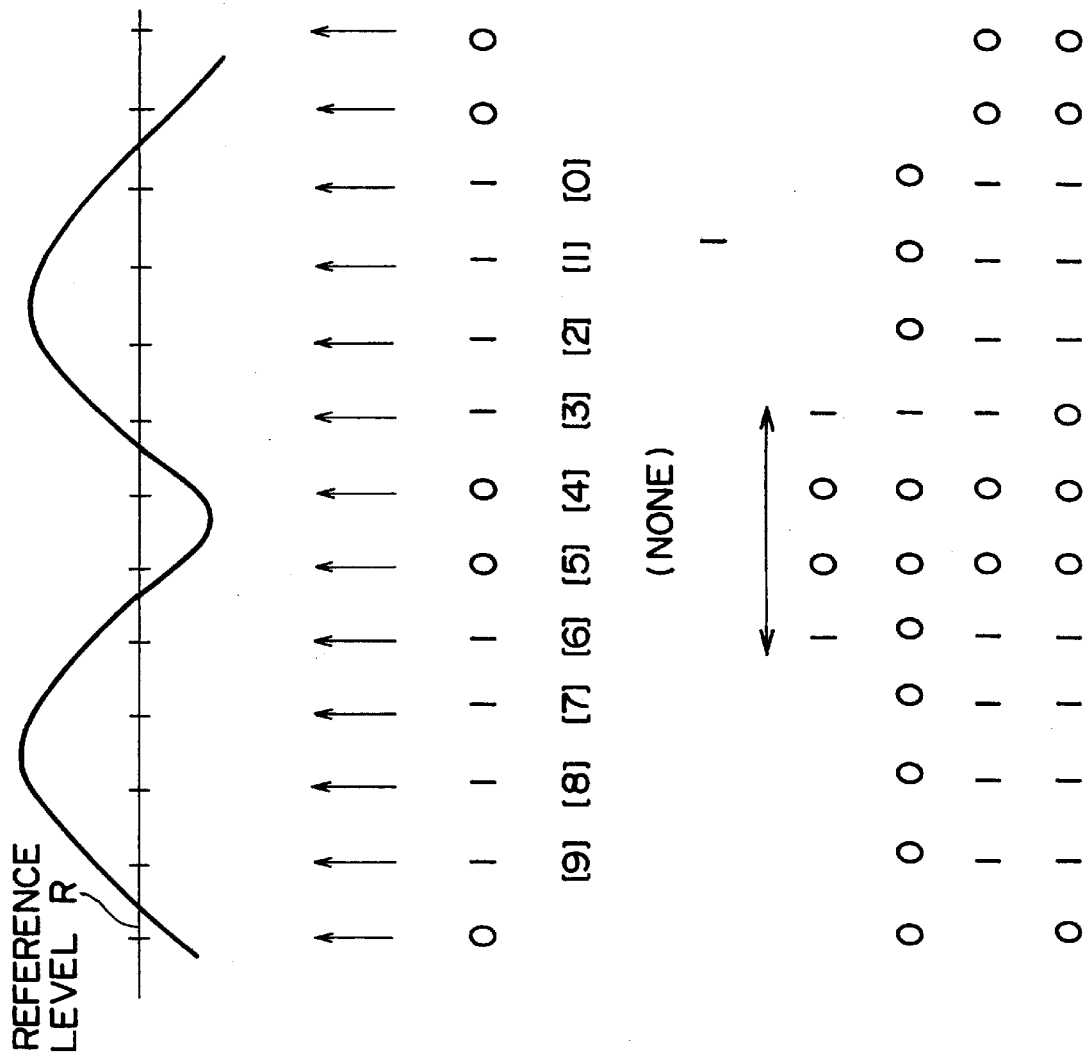
FIGS. 4A through 4J are timing charts illustrating the operation of the embodiment of this invention.

The timing chart in FIG. 4 shows an example of this operation. This bit string has the pattern 4T–2T–4T (FIG. 4C). This kind of pattern is not detected in either Step S5 or S7 so there is no flag output from the pattern detector 11. However, the error detector 5 does detect the error length 2T (FIG. 4G). In such cases, the correction position detector 6 generates correction position data (FIG. 4H) to match the flag stored in the memory 6A and sends this data to the correction processor 7. In the example in FIG. 4, the bit right after the error bit string is specified as the correction position.

The correction processor 7 processes the exclusive logic sums from correction position data (FIG. 4H) supplied from the correction position detector 6 and data loaded from the memory 12 (FIG. 4I) and sets these processing results as correction data (FIG. 4J).

In Step S4 on the other hand, when it is determined that 2T error length is not detected, operation proceeds to Step S12 and the error detector 5 determines if the error length 1T is present or not. When an error length 1T is detected by the error length detector 5, the detection data is output to the correction position detector 6 and the pattern detector 11. When an error length 1T is detected in Step S13, the pattern detector 11 generates a flag for the correction bit string for the bit strings both before and after the error bit string and then sends the output to the correction position detector 6. At this time, the correction position detector 6 generates correction position data specifying the correction positions for the bit strings both right before and right after the error bit string 1T and outputs this data to the correction processor 7. In Step S14, the correction processor 7 performs correction processing. This processing inverts the bits both right before and right after the correction bit string to a logic 0.

Restated, when a 1T error length occurs which is even worse than the error length 2T, the bits before and after are immediately corrected regardless of the patterns before and after the error bit string and the continuous length corrected to become 3T.

In Step S12, when it is determined the error length 1T cannot be detected, operation proceeds to Step S15 and data output processing is performed. In other words, even when an error actually occurs, the correction processor 7 does not perform correction and the data loaded from the memory 12 is output as is. Also, after processing in Step S11 or in Step S14, operation proceeds to Step S15 and when data processing is performed, the data in which error lengths 2T or 1T have been corrected to the specified length 3T is output from the correction processor 7.

Operation then proceeds to Step S16 where transmit of the data in sequence is performed by the memory 12. In other words, sending of data in sequence is performed because of the newly input channel clock data. Operation returns to Step S1 and processing is repeated in the same manner until it is determined that the playback of data has ended.

Figure 5:
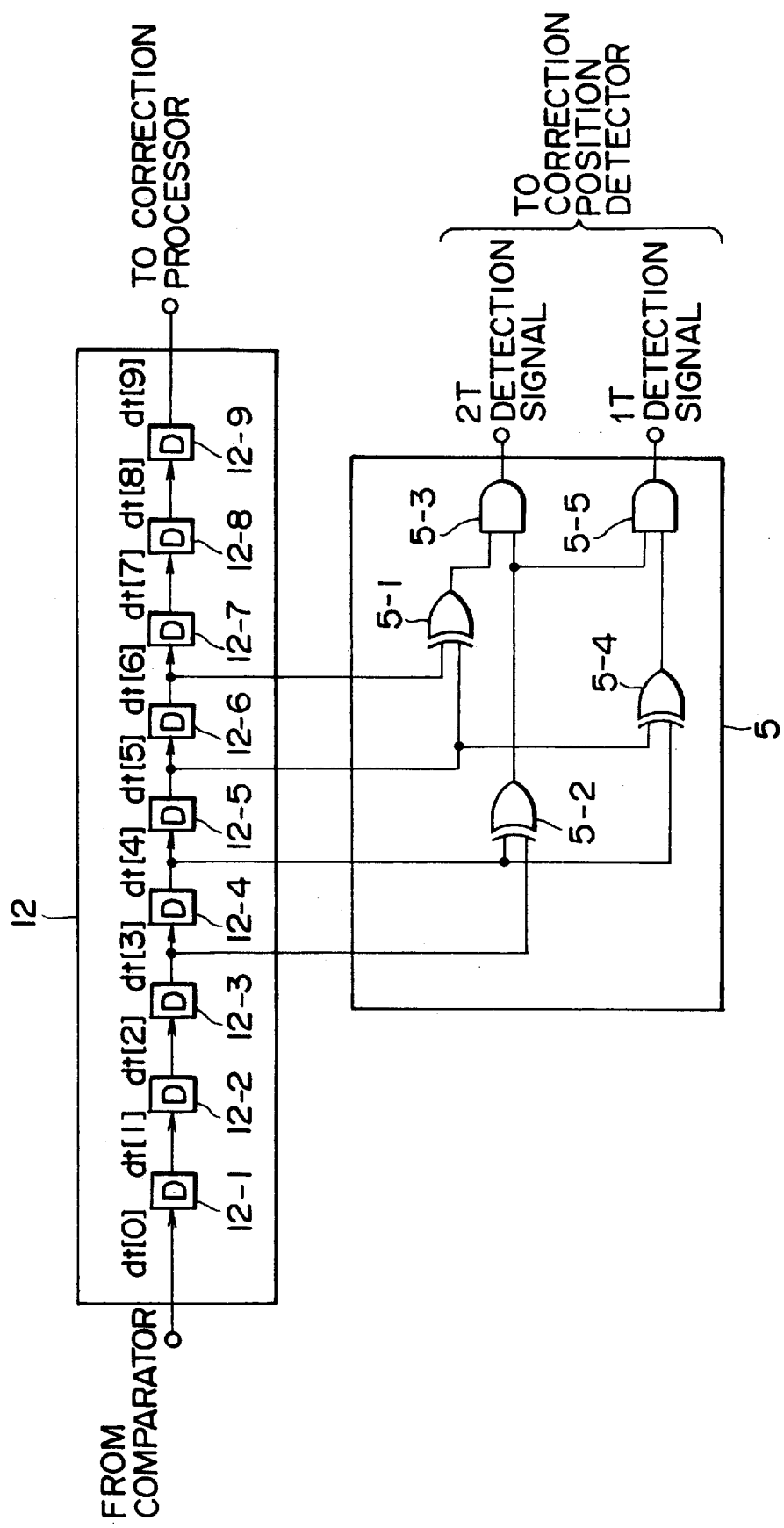
FIG. 5 is a block diagram showing the error length detector and memory of FIG. 1.

The structure of the memory 12 and error length detector 5 are shown in FIG. 5. In the memory 12, the 12 registers 12-1 through 12-9 are connected longitudinally as shown in FIG. 5. These registers 12-1 through 12-9 are input with one bit of data and send it in a latter step synchronized with the channel clock so that the memory 12 holds a total of 10 bits of data dt [0] through dt [9] (in utilizable state) (FIG. 3D and FIG. 4D). The error detector 5 is comprised of exclusive logic summing circuits 5-1, 5-2, 5-4 and AND circuits 5-3, 5-5. The exclusive logic summing circuit 5-1 processes the exclusive logic sums of data dt [5] and dt [6] of the input/output of the register 12-6 and sends the calculation results to the AND circuit 5-3. Also, the exclusive logic summing circuit 5-2 processes the exclusive logic sums of data dt [3] and dt [4] of the input/output of the register 12-4 and sends the calculation results to the AND circuit 5-3. The operation of the exclusive logic summing circuits 5-1, 5-2 and the AND circuit 5-3 allow the error length 2T to be detected.

The exclusive logic sums of data dt [4] and dt [5] of the input/output of the register 12-5 are calculated by the exclusive logic summing circuits 5-4 and the calculation results supplied to the AND circuit 5-2. The input of the other AND circuit 5-5 is supplied by the output of the exclusive logic summing circuits 5-2. The operation of the exclusive logic summing circuits 5-2, 5-4 and the AND circuit 5-5 allow the error length 1T to be detected.

The exclusive logic summing circuit 5-2 outputs a logic 1 only when one of data dt [3] and dt [4] is 0 and the other is a one. In the same way the exclusive logic summing circuit 5-1 outputs a logic 1 only when one of data dt [5] and dt [6] is 0 and the other is a one. Accordingly the AND circuit 5-3 outputs a logic 1 when the dt [6], dt [5], dt [4], dt [3] are a "0110" or "1001". Even when the data is "0101" or "1010", the AND circuit 5-3 will output a logic 1 but such bit strings are not present during the specified operation. Therefore, the above operation of the exclusive logic summing circuits 5-1, 5-2 and the AND circuit 5-3 allow the error length 2T to be detected.

In the same way the AND circuit 5-5 outputs a logic 1 only when one of data dt [5]. dt [4] and dt [3] are "101" or "010". This operation allows error length 1T to be detected.

FIG. 6 shows the structure of the pattern detector 11. In this arrangement, the AND circuit 11-1 calculates the logic sum of data dt [0] through dt [3] and inputs the calculation results to the OR circuit 11-7. In the same way, data dt [0] through dt [3] are inverted by the inverters 1-1 through 11-5 and the logic sum data calculated by the AND circuit 11-6 and output to the OR circuit 11-7. Accordingly a logic 1 is output by the OR circuit 11-7 when the dt [3], dt [2], dt [1], dt [0] are a "1111" or "0000".

The AND circuit 11-9 calculates the logic sums of the data dt [9] inverted by the inverter 11-8 and the data dt [8], dt [7], dt [6] and sends the output to the OR circuit 11-10. Also, the AND circuit 11-15 calculates the data dt [8], dt [7], dt [6] logic levels each respectively inverted by the inverters 11-11, 11-12 and 11-13, and the the logic sums of the output of the inverted 11-8 for data (in other words the same data as dt [9]) inverted by the inverter 1-14 and outputs the result to OR circuit 11-10. The OR circuit 11-10 therefore outputs a logic 1 when the data dt [9] dt [8], dt [7], dt [6] are "0111" or "1000".

In the embodiment in FIG. 6, the AND circuit 11-16 is also input with the 2T detector signal output from the AND circuit 5-3 of the error detector in FIG. 5. The AND circuit 11-16 calculates the logic sums output from the OR circuit 11-7, the OR circuit 11-10 and the AND circuit 5-3. In other words, when the output of the AND circuit 11-16 for data dt [9] through dt [0] is "0111001111" or "1000110000", a logic 1 is output. Accordingly, when the AND circuit 11-16 detects the pattern 3T–2T–xT (x≧4) a logic 1 is output (flag specifying the bit string behind the error bit string as the correction bit string). On the other hand, the AND circuit 11-22 calculates the logic sums of data dt [0] inverted by the inverter 11-21 and the data dt [3], dt [2], dt [1] and outputs the result to the OR circuit 11-23. The AND circuit 11-25 calculates the logic sums of data dt [1] data dt [2], dt [3], inverted by the inverters 11-3, 11-4, 1-5 and the data output of the inverter 11-2 inverted by the inverter 11-24 (in other words, the same data as data dt [0]) and sends the result to the OR circuit 11-23. The OR circuit 11-7 therefore outputs a logic 1 when the data dt [3] dt [2], dt [1], dt [0] are "1110", or "0001".

The AND circuit 11-26 calculates the logic sums of data dt [9] through data dt [6] and sends the result to the OR circuit 11-27. After these data dt [6] through data dt [9] are respectively inverted by the inverters 11-11, 11-12, 11-13, 11-28 the output is sent to the AND circuit 11-29. The AND circuit 11-29 calculates the logic sums of these inputs and sends the result to the OR circuit 11-27. The OR circuit 11-27 therefore outputs a logic 1 when the data dt [9] dt [8], dt [7], dt [6] are "1111" or "0000".

The AND circuit 11-30, just as with the AND circuit 11-16, is input with a 2T detection signal output from the AND circuit 5-3 of the error detector of FIG. 5. The AND circuit 11-30 calculates the logic sums of the AND circuit 5-3 as well as the output of the OR circuit 11-23, the output of the OR circuit 11-27. Accordingly, when the AND circuit 11-30 data dt [9] through dt [0] are "1111001110" or "0000110001" or in other words, when the pattern xT–2T–3T (X≧4) is detected, a logic 1 (flag specifying the bit string in front of the error bit string as the correction bit string) is output.

The structure of the memory 6A (storage means) inside the correction position detector 6 is shown in FIG. 6. In this embodiment, a latch 6A-1 or latch 6A-2 function to respectively latch signals output from the AND circuit 11-6 or AND circuit 11-30 in the zone where patterns 3T –2T–xT or xT–2T–3T are detected. The OR circuit 6A-3 calculates the logic sum outputs from the AND circuit 1-16 and AND circuit 11-30 and sends an output to the latch 6A-1 and latch 6A-2 as a latch clock. This action makes the latch 6A-1 output signal function as the pre-information storage signal specifying the rear of the flag and makes the latch 6A-2 output signal function as the pre-information storage signal specifying the front of the flag. When 3T–2T–xT is detected, the latch 6A-1 output sets to a logic 1 and a logic 1 is output from the next block. The output of the latch 6A-2 then sets to a logic 0 at this time. The output of the latch 6A-1 becomes a flag rear specifier signal. Also, when the xT–2T–3T pattern is detected the latch 6A-2 output sets to a logic 1 and a logic 1 is output from the next block. The output of the latch 6A-1 sets to a logic 0 at this time. The output of the latch 6A-2 becomes a flag front specifier signal. The latch 6A-1 and the latch 6A-2 are thus in a mutually inverted relationship.

If a pattern other than those above occurs when error 2T has been detected, neither of the latches 6A-1 and 6A-2 will latch so there will be no change in the logic level. In other words, a direction (in front or being) for either flag has been stored as pre-information. As a result, if the latches 6A-1 and 6A-2 are used, correction of 2T for other than the preset patterns will be performed in the immediately prior correction direction.

Figure 7:
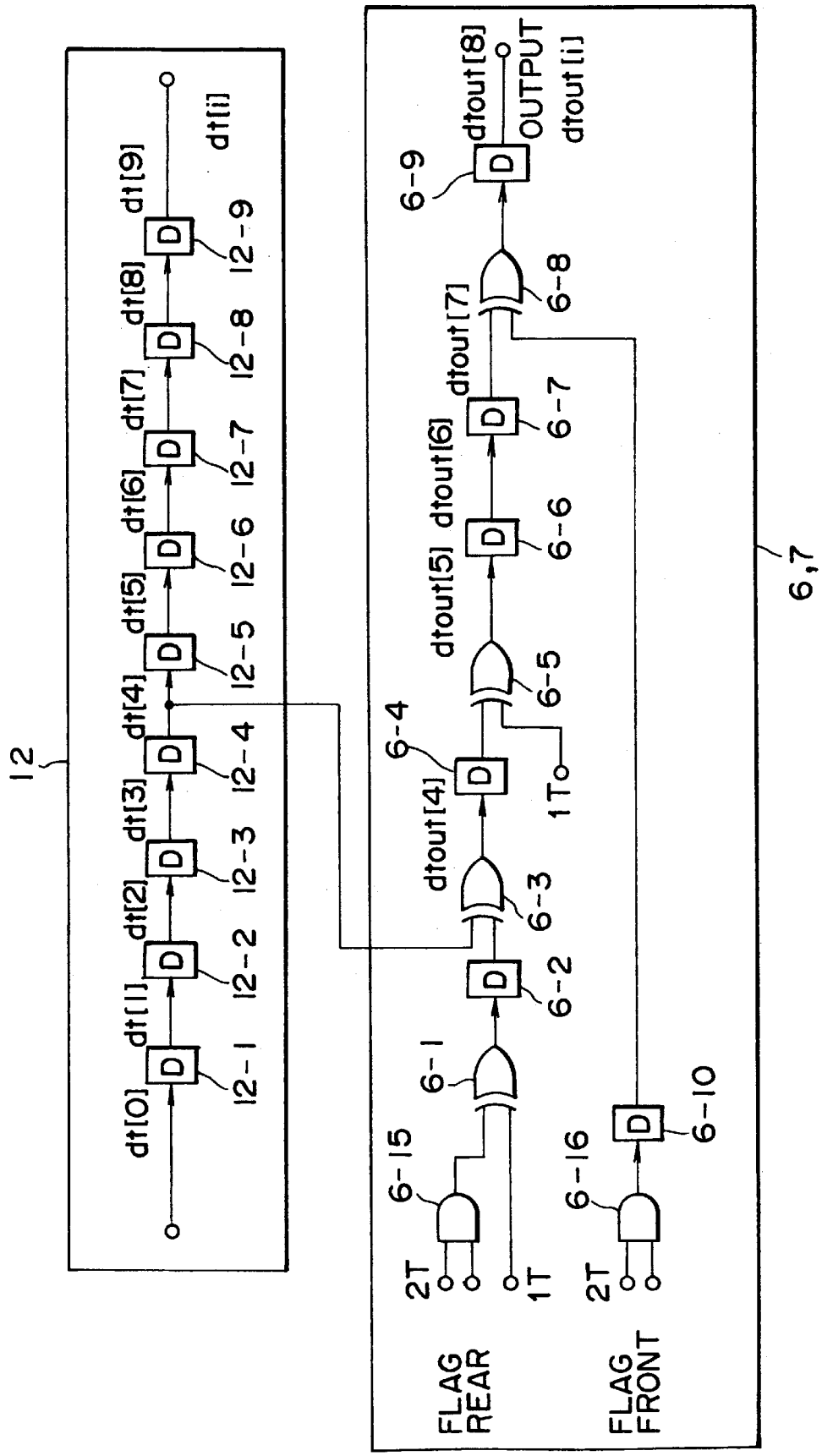
FIG. 7 is a block diagram showing the correction processor circuit and correction position detector in FIG. 1.

FIG. 7 shows the structure of the correction position detector 6 and the correction processor 7. In this version of the embodiment the data dt [4] from the register 12-4 of the memory 12 is input to one of the exclusive logic circuit 6-3 inputs. The AND circuit 6-15 calculates the logic sums of the 2T error detection signal output from AND circuit 5-3 of the error length detector 5 and the flag rear specifier signal output from the latch 6A-1. The OR circuit 6-1 calculates the logic sums of the AND circuit 6-15 outputs and the 1T detection signal (flag specifying bit string behind the error bit string as the correction bit string) output from AND circuit 5-5 of the error detector 5. The output of the OR circuit 6-1 is supplied to the other input of the exclusive logic circuit 6-3 by way of the register 6-3.

The output of the register 6-3 is supplied to one input of the exclusive logic circuit 6-5 by way of the register 6-4 and the 1T detection signal (flag specifying bit string before the error bit string as the correction bit string) output from AND circuit 5-5 of the error detector 5, is input to the other input of the exclusive logic circuit 6-5.

The output from the exclusive logic circuit 6-5 is fed to one of the inputs of the exclusive logic circuit 6-8 by way of the 2 stage registers 6-6 and 6-7. The logic sums from the 2T detection signal from AND circuit 5-3 of error detector 5 and the from the flag forward specifier signal output from the latch 6A-2 are calculated by the AND circuit 6-10 and these results fed to the other input of the exclusive logic circuit 6-8 by way of the register 6-10. The output from the exclusive logic circuit 6-8 is then output by way of the register 6-9. FIGS. 8A through 8H shows the timing of the register 6-2 which holds the output from the OR circuit 6-1. In other words, when a 3T-2T-xT pattern is detected by for instance, the AND circuit 11-16, the AND circuit 5-3 outputs a 2T detection signal including in the center of that pattern. The latch 6A-1 synchronizes with the detection signal 3T-2T-3T sent from the AND circuit 11-16, latches a high level signal and outputs this signal. In contrast, the latch 6A-2 synchronizes with the edge of the detection signal 3T-2T-xT since the AND circuit 11-30 cannot output an xT-2T-3T detection signal, proceeds to latch a low level signal and outputs this signal.

The AND circuit 6-15, calculates the logic sums of the latch 6A-1 output, the 2T detection signal output by the AND circuit 5-3 and supplies these calculation results to the register 6-2 by way of the OR circuit 6-1. However the register 6-2 is synchronized and triggers at the edge of the clock CLK rise pulse so that the output from the AND circuit 6-15 synchronizes with the edge of the clock CLK rise pulse issued right after inversion of that level to a high level and holds that signal.

Figure 9A:
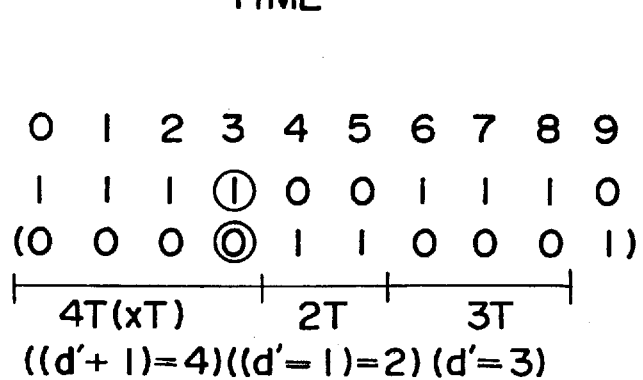
FIGS. 9A through 9C are tables illustrating the process of the flowchart in FIG. 2.
Figure 9B:
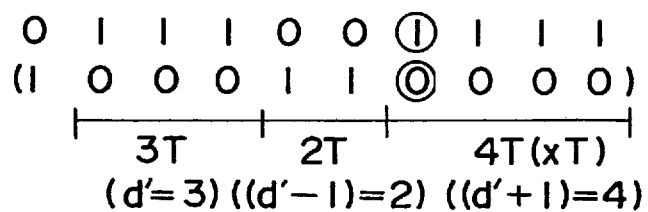
Figure 9C:
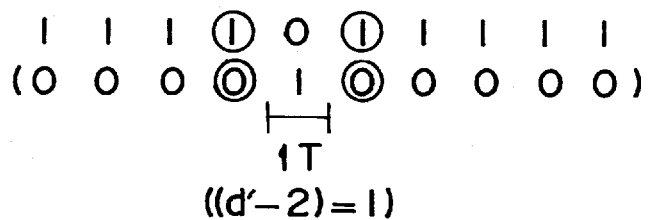

Next, the operation is explained in greater detail while referring to FIG. 9A through 9C. As related above, when the data dt [6] through dt [3] is "1001 or "0110", the data dt [5] and dt [4] are detected as error length 2T ((d'-1)=2) (FIG. 9A or 9B). And when the data dt [9] and dt [6] are "0111" or "1000" prior (timewise) to the error bit string, the continuous length 3T (d'=3) is detected; and when the data dt [3] and dt [0] are "1111" or "000" after (timewise) the error bit string, a continuous length as short as 4T) )d'+1)=4) is detected. A pattern detection signal 3T-2T-4T is output at this time (FIG. 9A).

When the 3T-2T-4T pattern is detected, the AND circuit 6-15 outputs a signal by way of the latch 6A-1. When this signal is output to the register 6-2 by way of the OR circuit 6-1, the data dt [4] is output from the register 12-4, and data as dtout [4] is supplied to the register 6-4 by way of the exclusive logic summing circuit 6-3. The register 6-4 at this time outputs the immediately prior supplied data dtout [5] to the register 6-6 by way of the exclusive logic summing circuit 6-5, and the register 6-6 then outputs data dtout [6], the register 6-7 outputs data dtout [7] to the register 6-9 by way of the exclusive logic summing circuit 6-8, and the register 6-9 then outputs data dtout [8].

When the next clock pulse is input while in this state, the register 12 of memory 12 holds and outputs the next data dt [3] contents. Also, the register 6-2 outputs the 3T-2T-xT detection signal. As a result, the data dt [3] is inverted by the exclusive logic summing circuit 6-3 and supplied to the register 6-4 as data dtout [3].

Afterwards, as each clock is supplied data is supplied to the register 6-4 through 6-9 and output in succession to subsequent stages. In this way, the logic level of the 1 bit (dt [3]) right after the error length, is inverted and the data output from the register 6-9 after correction. In other words, when the data "0111001111" or "1000110000" is input as shown in FIG. 9A, the data 0111000111" or "1000111000" is then output. However when the data dt [9] through dt [6] prior to the error bit string is "1111" or "0000", a continuous length as short as 4T((d'+1)=4) is detected and when the data dt [3] through dt [0] behind the error bit string is "1110" or "0001" a continuous length 3T( (d'=3) is detected. The pattern detection signal 4T-2T-3T is also output at this time (FIG. 9B).

When this pattern detection signal 4T-2T-3T is output, a signal is output from the AND circuit 6-16 by way of the latch 6A-2. When this signal is supplied to the register 6-10, the data dtout [7] is output to the register 6-7. Accordingly, when the next clock pulse is supplied, the register 6-7 holds and outputs data dtout [6] and the register 6-10 outputs a detection signal pattern 4T-2T3T. As a result, the exclusive logic summing circuit 6-8 inverts the logic level of data dtout [6] supplied from the register 6-7 and outputs this data to the register 6-9. The logic of the data dt [6] is thus inverted and corrected in this way. In other words, when the data "1111001110" or "0000110001" is input as shown in FIG. 9B, the data "1110001110" or "0001110001" is output.

When the data dt [5] through dt [3] bit string is "101" or "010" an error length bit string of 1T ((d'-2)=1) for data dt [4] is detected (FIG. 9C). When the error length 1T detection signal is input to the OR circuit 6-1 and the exclusive logic summing circuit 6-5, the register 6-4 outputs data dtout [5] and the register 6-4 outputs data dt [4]. Therefore, the logic level of the data dtout [5] output from register 6-4 is inverted by the exclusive logic summing circuit 6-5 and supplied to the register 6-6.

When the next clock pulse is input, the register 6-6 holds the data dtout [5] whose logic level was inverted and outputs this data to the register 6-7 in a subsequent stage. At this time, the register 6-2 holds the 1T error signal input from the OR circuit 6-1 and outputs the signal to the exclusive logic summing circuit 6-3.

Further, while the data dtout [5] is output by the register 6-4, when the next clock pulse is input, the register 12-4 holds the data dtout [4] output by supplied from the register 12-4 by way of the exclusive logic summing circuit 6-3 and outputs this data to the register 6-6 by way of the exclusive logic summing circuit 6-5.

At this time, the register 12-4 holds the next data dt [3] and along with supplying this data to one input of the exclusive logic summing circuit 6-3, the register 6-2 outputs the error detection signal 1T to the exclusive logic summing circuit 6-3. The exclusive logic summing circuit 6-3 therefore inverts the logic level of the data dt [3] and supplies this data to the register 6-4 as data dtout [3]. So when the next clock pulse in input, the data dt [3] whose logic level was inverted is held in the register 6-4 and supplied to the register 6-6 by way of the exclusive logic summing circuit 6-6.

The data held in each register is transferred in succession to a subsequent stage as the clock pulses are supplied. Thus, the logic level of the data dt [3] and dt [5] is inverted and correction performed. Restated, when the data "1111101111" or 0000010000" is input as shown in FIG. 9C, the data "1111000111" or "0000111000" is then output.

The circular marks (○) in FIGS. 9A through 9C indicate the correction bit.

Figure 10:
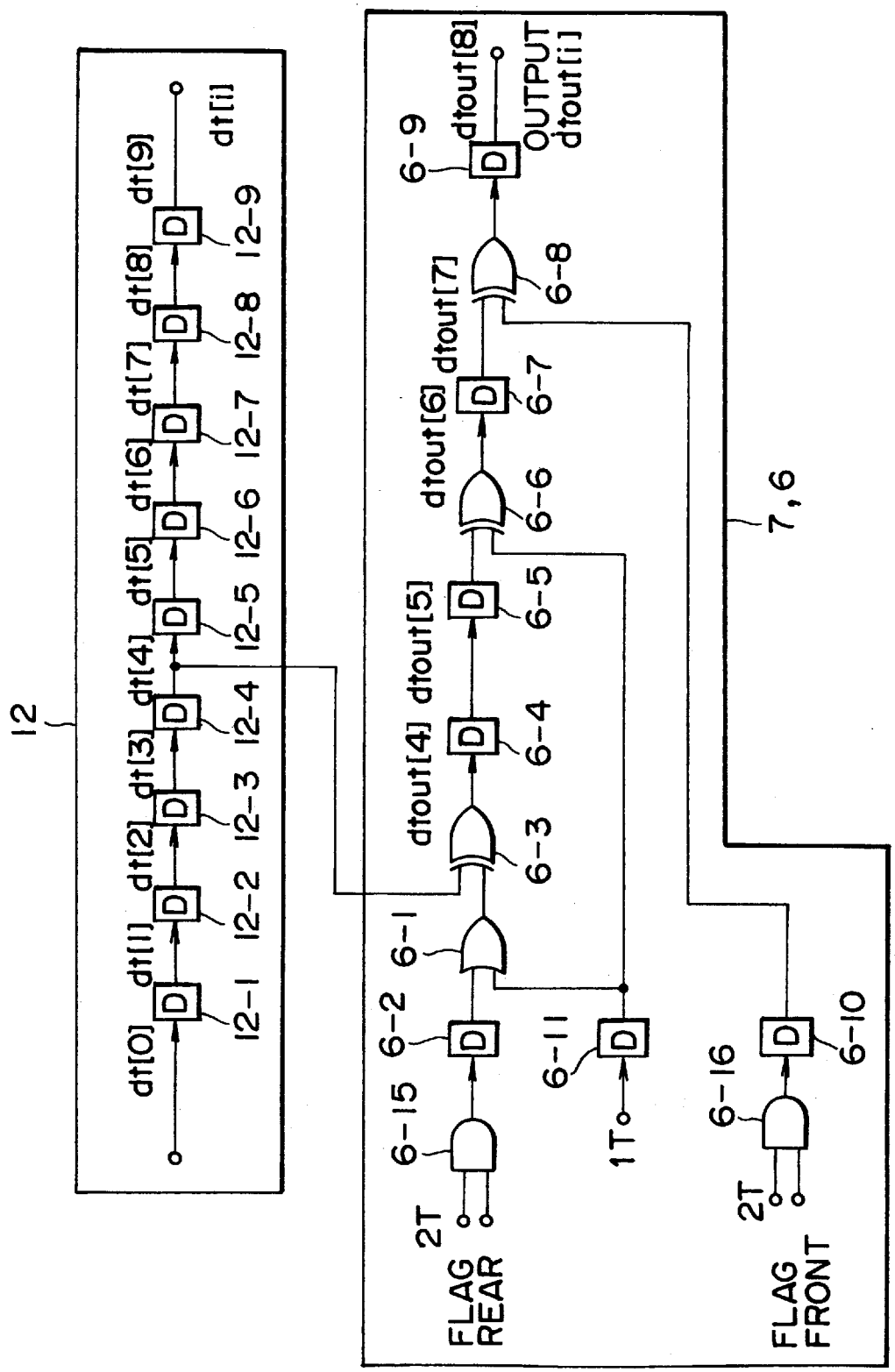
FIG. 10 is a block diagram of another embodiment of the correction processor circuit and correction position detector of FIG. 1.

FIG. 10 shows another embodiment of the correction position detector 6 and the correction processor 7. In this embodiment, when the logic sums of the detection signal 2T output by the AND circuit 5-3 of the error length detector and the flag rear specifier signal output from the latch 6A-1 are calculated by the AND circuit 6-15 and input to the register 6-2, the resultant output from the register 6-2 is supplied to one input of the OR circuit 6-2. A 1T detection signal is supplied to the other input of the OR circuit 6-1 by way of the register 6-11. The output of the OR circuit 6-1 is supplied to one input of the exclusive logic summing circuit 6-3 and and the output from register 12-4 of the memory 12 is supplied to the other input of the exclusive logic summing circuit 6-3.

The output of the exclusive logic summing circuit 6-3 is supplied to one input of the exclusive logic summing circuit 6-5 by means of the registers 6-4 and 6-6. The 1T detection signal is input by way of the register 6-11 to the other input of the exclusive logic summing circuit 6-5. The output of the exclusive logic summing circuit 6-5 is supplied to one input of the exclusive logic summing circuit 6-8 by way of the register 6-7. The outputs of the detection signal 2T from the AND circuit 5-3 of the error length detection circuit 5, and the output of the flag forward specifier output from the latch 6A-2 have their logic outputs calculated in AND circuit 6-16 and the resultant output is supplied to the other input of the exclusive logic summing circuit 6-8 by way of the latch 6A-2. The output from the exclusive logic summing circuit 6-8 is sent by way of the register 6-9.

Next, the operation will be explained. When the 3T–2T–xT detection signal is output, a signal is issued from the AND circuit 6-15 by way of the latch 6A-1. When this signal is input to the register 6-2, the register 12-4 of the memory 12 outputs data dt [4] and this is supplied as data dtout [4] to the register 6-4 by way of the exclusive logic summing circuit 6-4. When the next clock pulse is input while in this state, the register 6-2 holds the detection signal output from the AND circuit 6-15 and supplies it to one input of the exclusive logic summing circuit 6-3 by way of the OR circuit 6-1. Also, the data dt [3] held by the register 12-4 is supplied at this time to the other input of the exclusive logic summing circuit 6-3. As a result, the exclusive logic summing circuit 6-3 outputs data dt [3] at an inverted logic level data dtout [3] to the register 6-4.

When the next clock pulse is input, the data dtout [3] which is the output of the exclusive logic summing circuit 6-3 is held in the register 6-4 and output to the register 6-6 in a subsequent stage. The correction processing is thus performed as shown in FIG. 9A.

On the other hand, when the xT–2T–3T pattern detection signal is detected by the AND circuit 11-30, this output signal is output to the AND circuit 6-16 by way of the latch 6A-2. The register 6-7 then outputs the result as data dtout [7]. When the next clock pulse is input, the register 6-10 holds the output signal from the AND circuit 6-16 and supplies this signal to one input of the exclusive logic summing circuit 6-8. The other input of the exclusive logic summing circuit 6-8 is input with the next dtout [6] held by the register 6-7. As a result, inversion of the logic level of data dtout [6] is performed by the exclusive logic summing circuit 6-8 and the result sent to the register 6-9. The correction processing is thus performed as shown in FIG. 9B.

Further when the 1T detection signal is input to the register 6-11, the register 6-6 outputs data dtout [6]. Also the register 12-4 outputs data dt [4]. When the next clock pulse is input while in this state, the register 6-11 holds the 1T detection signal and along with supplying one input of the exclusive logic summing circuit 6-5 also supplies the other input of the exclusive logic summing circuit 6-3 by way of the OR circuit 6-1. The register 6-6 holds the next data dtout [5] and supplies this data to the other input of the exclusive logic summing circuit 6-5 so that the logic level is inverted and supplied to the register 6-7. Further, the register 12-4 holds and outputs the data dt [3] so that the logic level of dt [3] so that the logic level is inverted by the logic summing circuit 6-3 which sends this data as data dtout [3] to the register 6-4. The correction processing is thus performed as shown in FIG. 9C.

Figure 11:
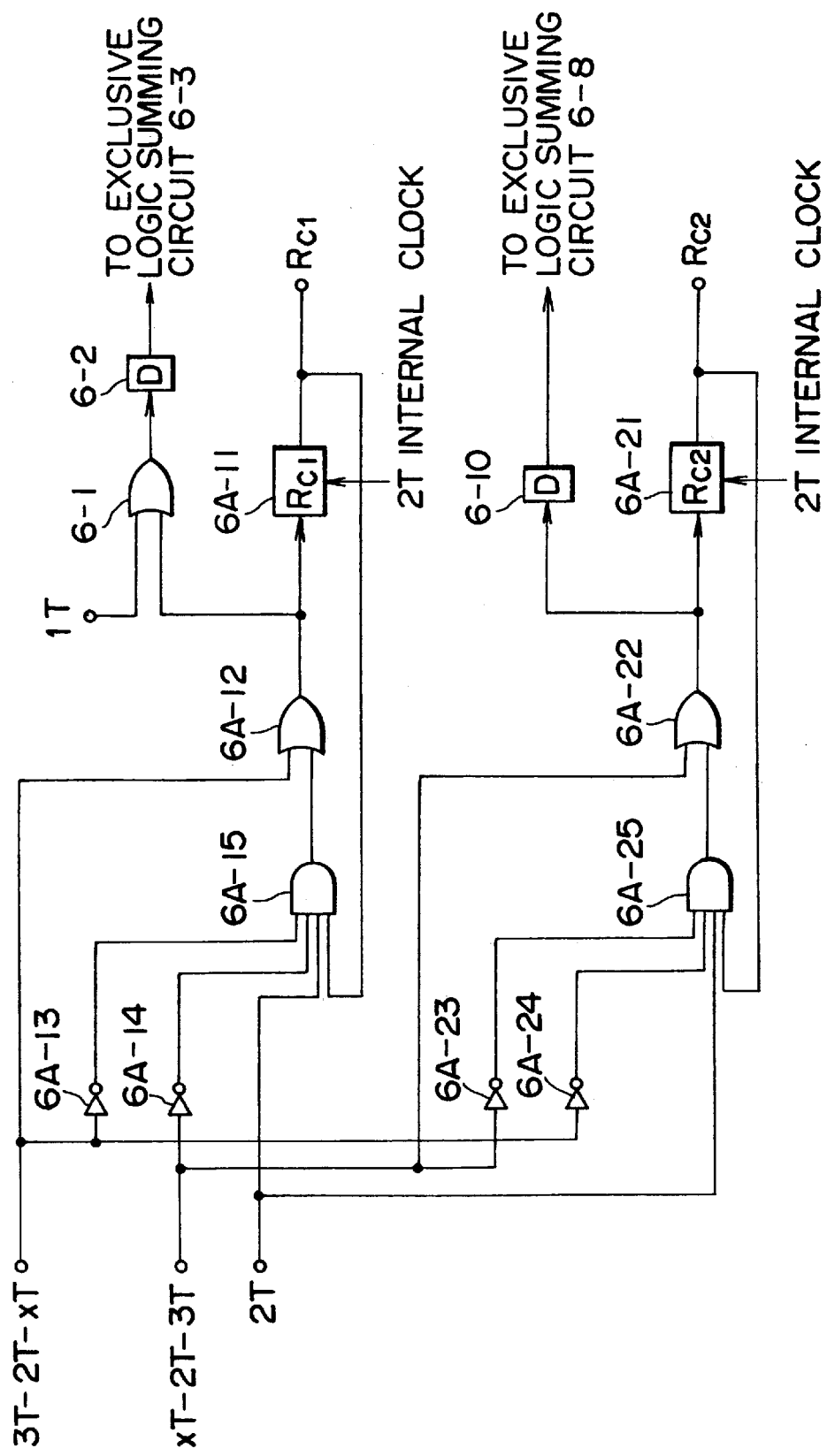
FIG. 11 is a block diagram illustrating the memory for the compensation position detector of FIG. 1.
Figure 12:
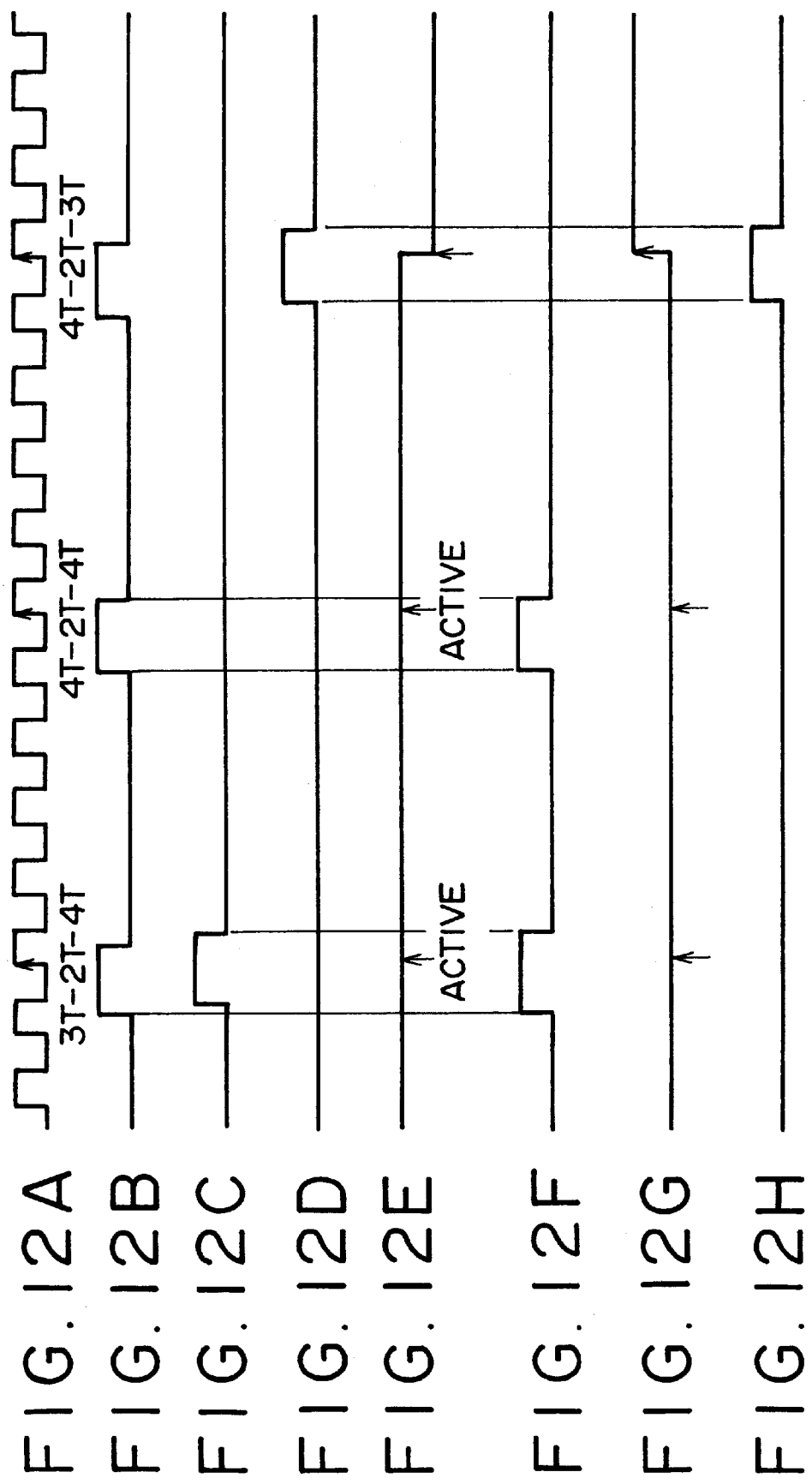
FIGS. 12A through 12H are timing charts showing the operation of the embodiment in FIG. 11.

The structure of another embodiment of the memory 6A inside the position correction detector 6 is shown in FIG. 11. In this embodiment, the 3T–2T–xT detection signal output from the AND circuit 11-6 is supplied to one of the inputs of the OR circuit 6A-12 and also supplied to one input of the AND circuit 6A-15 by means of the inverter 6A-13. The the 3T–2T–xT detection signal output from the AND circuit 11-30 is input again to the AND circuit 6A-15 by means of the inverter 6A-14. This AND circuit 6A-15 is input also with the 2T detection signal output from the AND circuit 5-3 and also input by the output RC1 from the latch 6A-11. The output from the AND circuit 6A-15 is supplied to the other input of the OR circuit 6A-12.

The output from the OR circuit 6A-12 is supplied to the latch 6A-11 and to one input of the OR circuit 6-1. The 1T detection signal output from the AND circuit 5-5 is supplied to the other input of the OR circuit 6-1. The output of the OR circuit is supplied to one input of the exclusive logic summing circuit 6-3 by way of the register 6-2 as shown in FIG. 7.

One input of the OR circuit 6A-22 is input with the xT–2T–3T detection signal output from the AND circuit 11-30. This xT–2T–3T detection signal is also input to the AND circuit 6A-25 by means of the inverter 6A-23. The 3T–2T–xT detection signal output from the AND circuit 11-16 is input to the AND circuit 6A-25 by way of the inverter 6A-24. This AND circuit 6A-25 is also supplied with an output Rc2 from the latch 6A-21 and the 2T detection signal output from the AND circuit 5-3. The output from the AND circuit 6A-25 is supplied to the other input of the OR circuit 6A-22. The output from this OR circuit 6A-22 is supplied both to the latch 6A-21 and to the exclusive logic summing circuit 6-8 by way of the register 6-10 as shown in FIG. 7.

The operation will next be explained while referring to the timing charts in FIG. 12A through 12H. When for instance, the pattern 3T–2T–4T, the pattern 4T–2T–4T, or the pattern 4T–2T–3T appear at the specified interval, the AND circuit 5-3 detects the 2T at the center of the respective patterns and issues a corresponding detection signal. When the pattern 3T–2T–xT appears, the detection signal is output by the AND circuit 11-30.

When the 3T–2T–xT detection signal and the xT–2T–3T detection signals are both at low levels, the output from the inverters 6A-13 and 6A-14 are at a high level. Accordingly, when the latch 6A-11 sends a high level Rc1 output; the AND circuit 5-3 outputs a 2T detection signal and the AND circuit 6A-15 outputs a high level.

Also, When the AND circuit 11-16 outputs the 3T–2T–xT detection signal, the output from the OR circuit 6A-12 is a high level while this 3T–2T–xT detection signal detection signal is being input.

When the 3T–2T–4T pattern is detected, the Rc2 output of the latch 6A-21 is at low level so that the output of the AND circuit 6A-25 remains unchanged at a low level even when 2T has been detected. The xT–2T–3T pattern has not been detected at this time so the output of the OR circuit 6A-22 remains at low level.

A clock pulse CLK is supplied to the latch 6A-11 and the latch 6A-12 in the interval that the 2T detection signal is issued, the input signal is latched in synchronization with the rising edge of this clock pulse. Accordingly, the latch 6A-11 will latch at high level and the latch 6A-21 will latch at low level.

The same operation is used when the 4T–2T–4T pattern occurs.

However when a 4T–2T–3T pattern is detected by the AND circuit 11-30, the AND circuit 6A-15 and therefore the OR circuit 6A-12 outputs set to a low level since the output from the inverter 6A-14 becomes a low level. As a result, the latch 6A-11 latches at a low level and the latch 6A-11 output Rc1 changes from a high level to a low level.

Also, when a 4T–2T–3T pattern signal is detected, the OR circuit 6A-20 output sets to a high level so the latch 6A-21 latches at that high level and latch 6A-21 output Rc2 changes from a low level to a high level.

The above principle can also be applied when the maximum continuous length for the identical symbol is specified as k' even when correcting continuous length (k'+1) channel bit data. In such cases the processing will comply with the flow chart shown in FIG. 13. The basic processing is the same as in FIG. 2 however the process in Steps S24, S25, S27, S30, S32 and S34 differs from Steps S4, S5, S7, S10 S12 and S14 in FIG. 2.

In other words, the error length 12T ((k'+1)=12) of Step S24 and the error length 13T ((k'+2)=13) of Step S32 are respectively detected by the error length detector 5. Upon which, the 12T data or the 13T data is corrected to the specified length 11T(k'=11) in Step S30 and Step 34 by the correction processor 7.

In Steps S25 and S27, the pattern 1T–12–xT or the pattern xT–12T–11T are detected by the pattern detector 11. The x for these patterns is a value less than 10.

At least 34 registers are provided in the memory 12, so that data dt [0] through dt [35] can be utilized when x=10.

Figure 13:
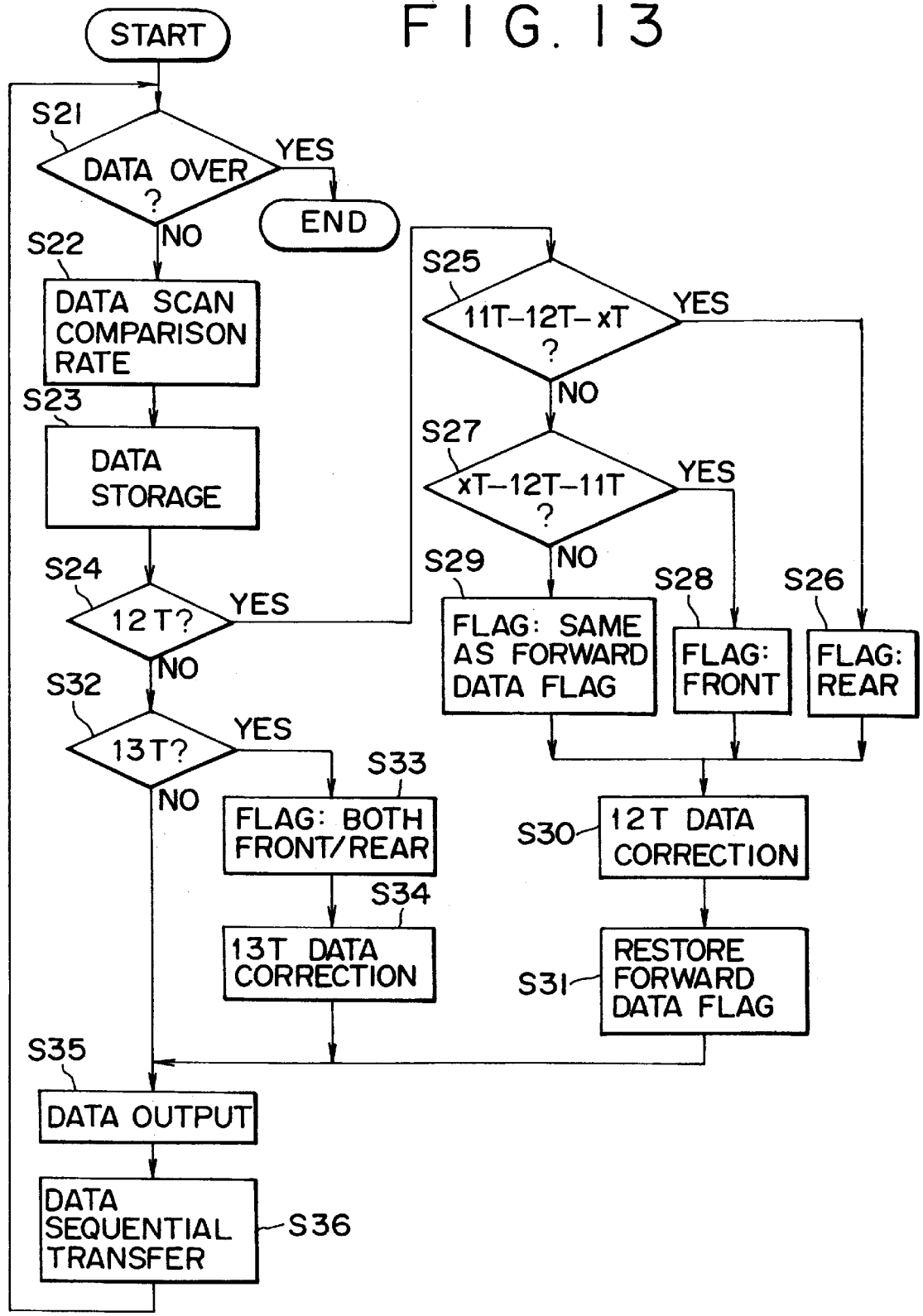
FIG. 13 is a flowchart illustrating the correction operation of maximum continuous length for the embodiment in FIG. 1.
Figures 14A, 14B, 14C:
FIGS. 14A through 14C are tables showing error detection, pattern detection and correction strings for the flowchart of FIG. 13.

FIGS. 14A through 14C show error detection, pattern detection and correction strings for the flowchart of FIG. 13. As shown in FIG. 14A, when data dt [24] through data dt [11] are 10000000000001" or "0111111111110", the data dt [23] through dt [12] are detected as error length 12T ((k'+1)=12). Also, when the data dt [34] through [23] before the error bit string is "111111111110" or "000000000001" and denied as outputs, then continuous lengths below 10T ((k'–1)=10) are detected; and when data dt [12] through dt [0] to the rear of the error bit string are "0111111111110" or "1000000000001" the continuous length 1T (k'=11) is detected.

The patterns below 10T–12T–11T are detected at this time. In this case, the logic level for dt [23] is inverted and correction performed.

In the same way, when the data dt [35] through [23] in front of the error bit string are "0111111111110" or 1000000000001" as shown in FIG. 14B, a continuous length 11T (k'=11) is detected; when the data dt [12] through [1] before the error bit string is "011111111111" or "100000000000" and denied as outputs, then continuous lengths below 10T ((k'–1)=10) are detected. The patterns below 11T–12T–10T are detected at this time. In this case, the logic level for dt [12] is inverted and correction performed.

Further, as shown in FIG. 14C, when the data dt [25] throughdt [11] are "100000000000001" or "011111111111110", the data dt [24] through dt [12] are detected as the continuous length 13T ((k'+2)=13). In this case, the logic levels of dt [24] and dt [12] are inverted and correction performed.

Also, in the above embodiment of this invention, the playback RF signal was compared with one reference level R and converted to binary data which is "1" and "0" however as shown in FIG. 15, two reference levels H and L are provided and when the playback RF signal level is the size of the difference between the two H and L reference levels, a logic level 1 is output and when larger than the reference level H or when small than the reference level L a logic 0 is output and the playback RF signal can be placed in binary. In these specifications, this binary processing is called reverse NRZI modulation and the data is called edge data. In order to provide a comparison, one reference level R and the playback RF signal are compared and the data thus obtained is referred to as level data. The edge data from comparing the playback RF signal with a reference level R and forming binary data is further changed from 1 to 0 or from 0 to 1 and set as 1 (edge data) and when not changed can be converted to the code 0.

Figure 2:
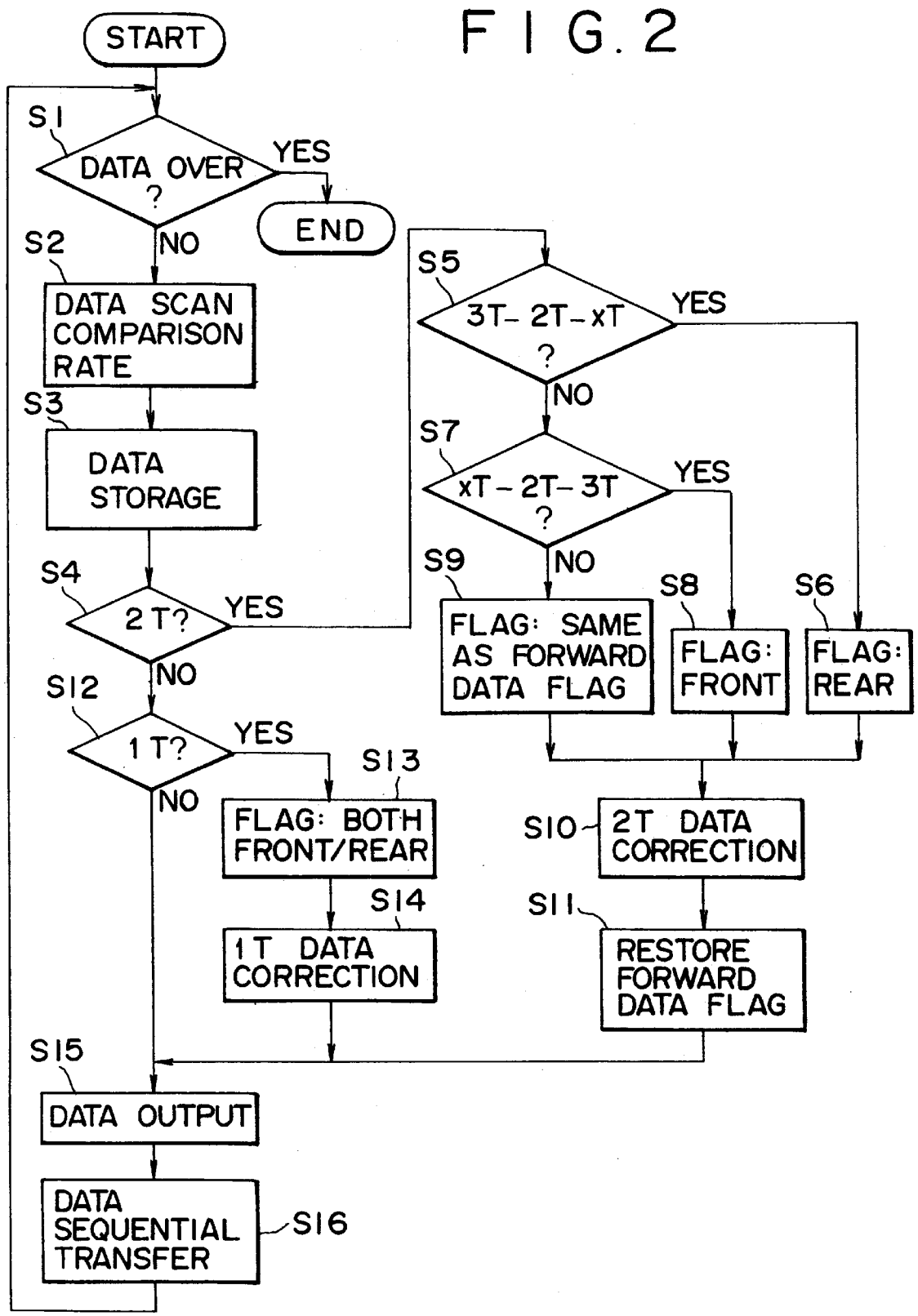
FIG. 2 is a flowchart illustrating correction of the minimum continuous length in the embodiment of this invention.
Figure 16:
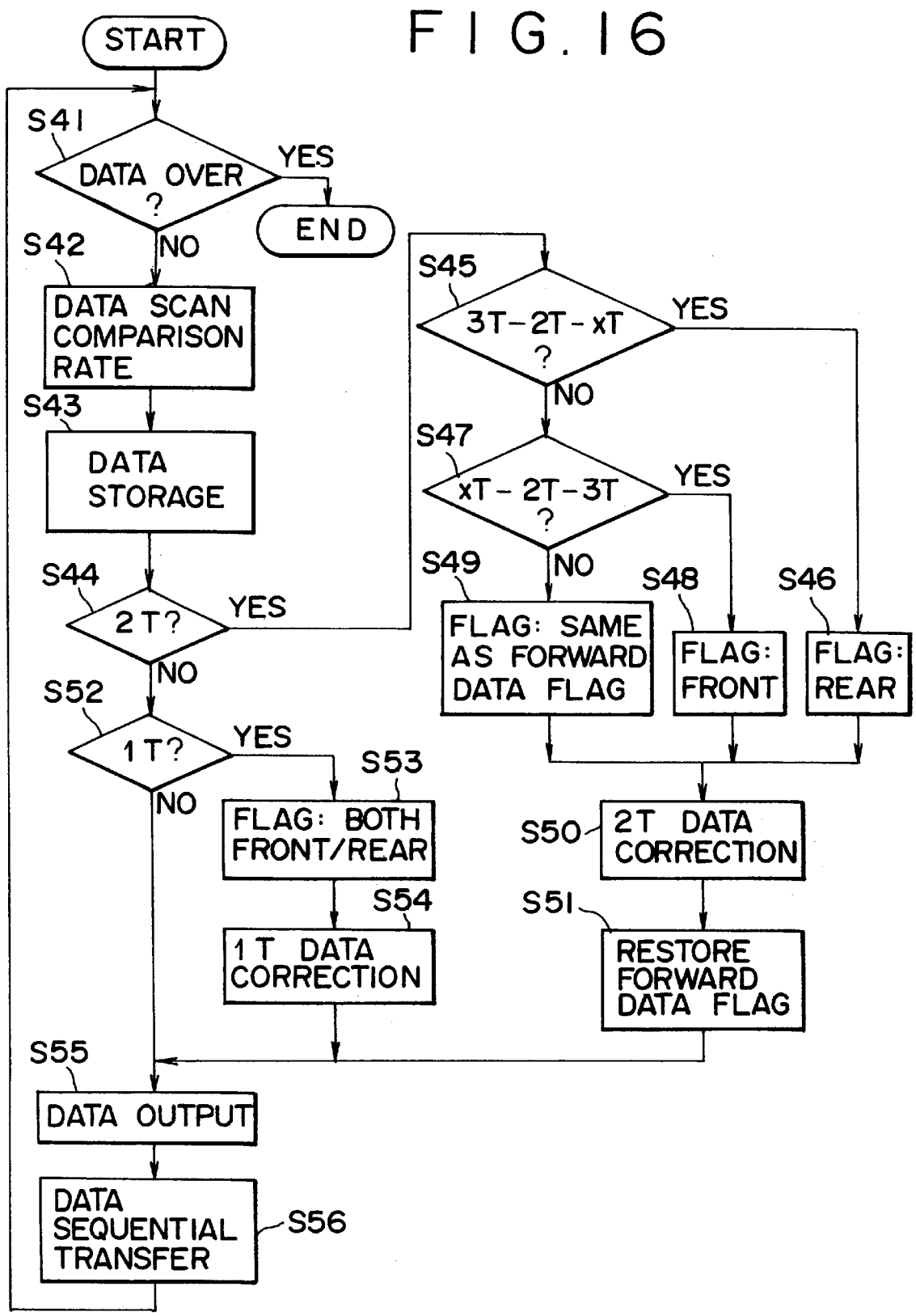
FIG. 16 is a flowchart showing correction operation of the minimum continuous length during reverse NRZI modulation in the embodiment of FIG. 1.

As shown in FIG. 2, in the process for correcting channel bit data which is the identical symbol for continuous length (d'–1), the processing as shown in FIG. 16 is performed for the NRZI modulated code in the comparator 4.

In the processing in FIG. 16, is basically the same as the processing in FIG. 2, however the detection processing of Steps S42, S44, S45, S47 and S52 as well as the Step S50, S54 correction processing differs from the detection processing in Steps S2, S4, S5, S7 and S12 in FIG. 2 as well as the correction processing in Steps S10 and S14.

In other words, in the case of the process shown in FIG. 2 and the reverse NRZI modulation shown in FIG. 16, the error length for the Steps S4 S12 or the Steps S44 and S2 is specified as 2T or 1T, and the patterns Steps S5, S7 or Steps S45, S47 are expressed as 3T–2T–xT or xT–2T–3T (x≧4). However, in contrast to the detection of 2T, or 1T in the process of FIG. 2 of (d'–1)=1, (d'–2)=1, the detection for 2T in FIG. 16 is (d–1)=1, (d–2)=0.

Also, in the pattern detection of 3T–2T–xT or xT–2T–3T in contrast to the process in FIG. 2, in which the detection is (d'=3)–((d'–1)=2–((d'+(x–3))=3+(x–3)) or is ((d'+(x–3))= 3+(x–3))–((d'–1)=2)–(d'–3) the pattern detection in FIG. 16 is (d=2)–((d–1)=1)–((d+(x–3))=2+(x–3)) or ((d+(x–3))=2+ (x–3))–((d–1)=1)–(d=2).

Further, in the correction to the specified length 3T of the error length 2T, 1T in Steps S10 and S14 in FIG. 2, a correction to d'=3 for (d'–1)=2, (d'–2)=1 is made. However, in correction to the specified length 3T for error length 2T, 1T in Steps S50, S54 in FIG. 16, a correction to d=2 for (d–1)=1, (d–2)=0 is made.

Figure 17:
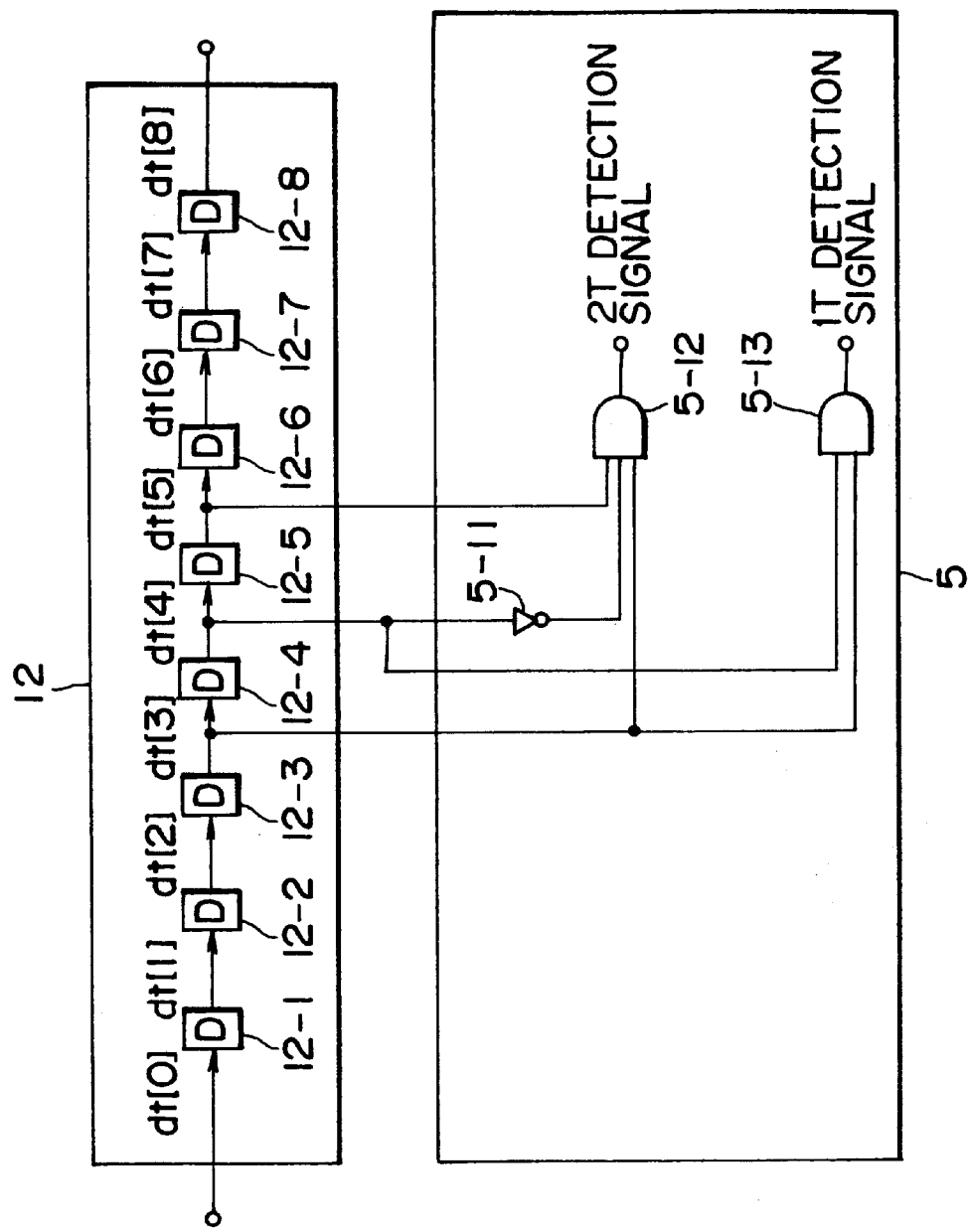
FIG. 17 is a block diagram of another embodiment of the error detector of FIG. 1.

Detection of error lengths 2T, 1T for Steps S44, S52, the following is performed by means of the error detector shown in FIG. 17.

More specifically, in the error detector 5, the data dt [3] and dt [5], and the data logic sum for data dt [4] inverted by the inverter 5-11 are calculated by the AND CIRCU1T 5-12. In the AND circuit 5-12, when the data [dt]5 and dt [3] is a logic 1 and further, the data dt [4] is a logic 0 or in other words, when data dt [4], dt [5] and dt [3] are "101", the logic level 1 is output at the 2T detection signal (The 2T error length can be detected even if the output of the register 12-4 is not monitored by the AND circuit 5-12.). The AND circuit 5-13 calculates the logic sums of the data dt [3] and data dt [4] and outputs the calculation result as detection signal 1T. When the output from the AND circuit 5-12 is "11" for data dt [4] and dt [3] a logic 1 is set.

Figure 18:
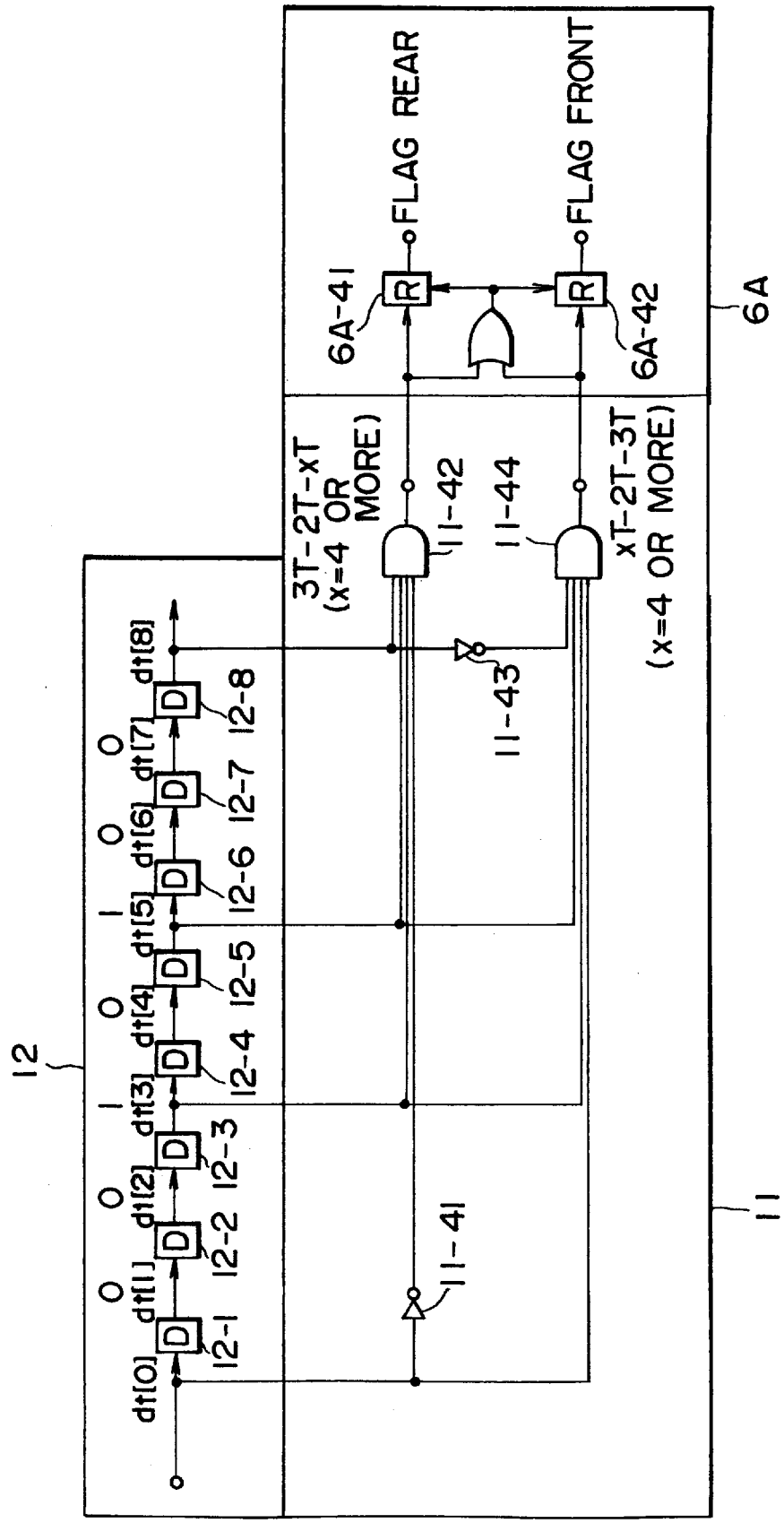
FIG. 18 is a block diagram of another embodiment of the pattern detector of FIG. 1.

The patterns 3T–2T–xT or the xT–2T–3T (x≧4) in Steps S45 and Steps S47 are detected by the pattern detector 11 shown in FIG. 18.

More specifically, in the pattern detector 11, the AND circuit 11-42 calculates the sums of the data dt [0] logic inverted by the inverter 11-41, and the data dt [3], dt [5] and dt [8] logic sums. The data dt [8] logic inverted by the inverter 11-43, and the data dt [0], dt [3], dt [5] is input to the AND circuit 11-44. The AND circuit 11-44 then calculates the logic sums from these respective inputs.

As long as an error does not occur, the "0" appears continuously twice at a minimum, so the output from the AND circuit 11-42 is data dt [8], =dt [5]=dt [3]=1 and when dt [7]=dt [6]=dt [4]=dt [2]=dt [1]=dt [0], the value detected as pattern 3T–2T–xT is a logic 1. On the other hand, with output of the AND circuit 11-44 as dt [5]=dt [3]=dt [0]=1 and further when dt [8]=dt [7]=dt [6]=dt [4]=dt [2]=dt [1]=0, a logic 1 is output as the detected pattern xT–2T–3T.

In FIG. 18, an embodiment of the memory 6A is again shown. In this embodiment, the latch 6A-41 latches the output of the AND circuit 11-42 and the latch 6A-42 latches the output of the AND circuit 11-44. The OR circuit 6A-43 calculates the logic sums of the outputs of the AND circuit 11-42 and 11-44 and these calculation results are supplied as clock pulses to the latches 6A-41 and the latch 6A-42 for control of the above-mentioned latches. In other words, the process performed is the same as for the memory 6A in FIG. 6.

Figure 19:
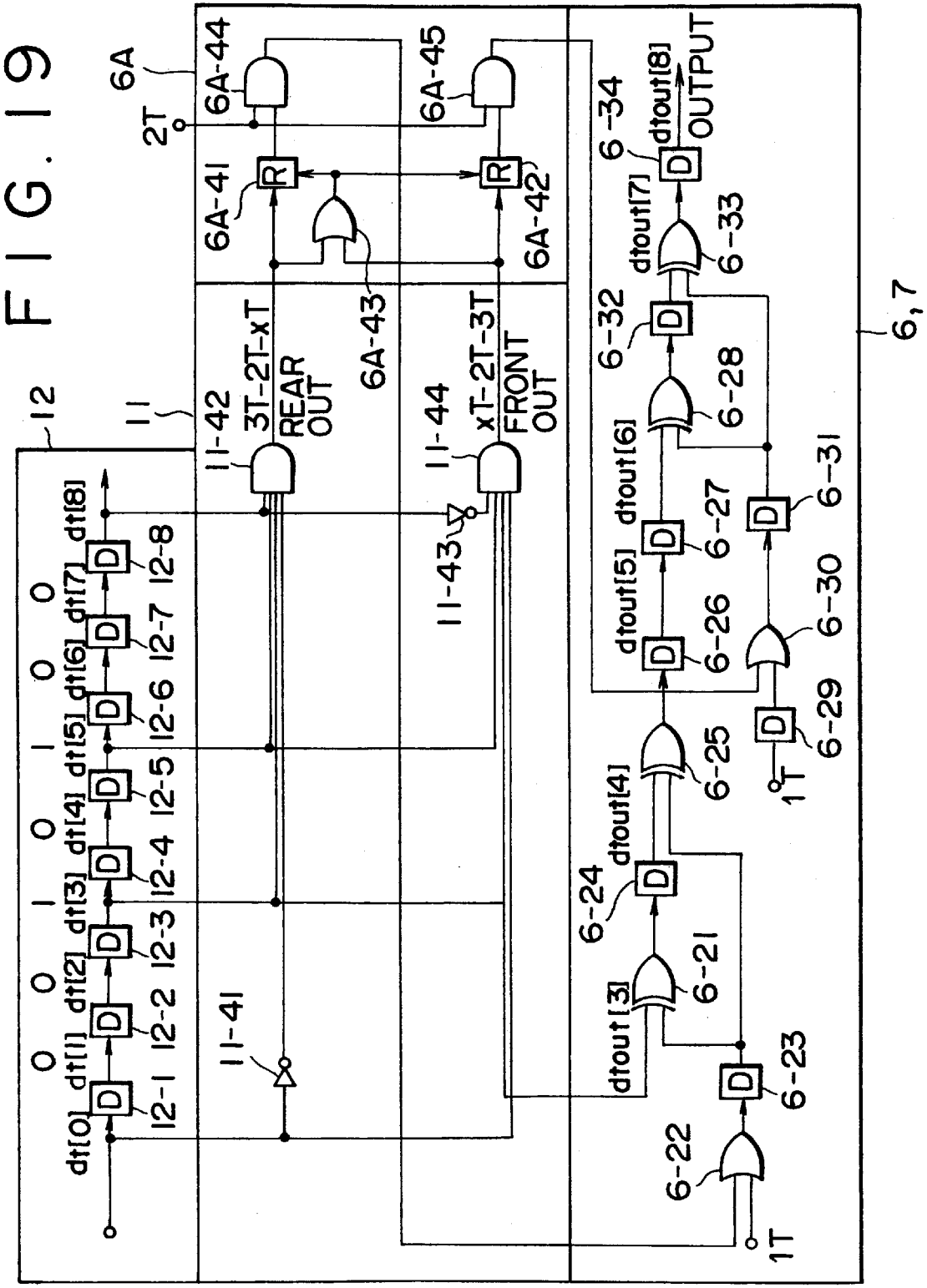
FIG. 19 is a block diagram of another embodiment of the the correction processor circuit and correction position detector of FIG. 1.

In FIG. 19, another embodiment of the correction position detector 6 and the correction processor 7 is shown when processing edge data in Steps S50 and S54 of FIG. 16. The exclusive logic summing circuit 6-21 is supplied at one input with data dtout [3] from the output data dt [3] from the register 12-3 of memory 12. The other input of the exclusive logic summing circuit 6-21 is supplied with the following by means of the OR circuit 6-22 and the register 6-23: the latched signal of the latch 6A-41 as a pattern detection signal 3T–2T–xT output from the AND logic circuit 11-42; the output signal from the AND circuit 6A-44 calculated from the logic sums of the 2T detection signal from the AND circuit 5-12; the 1T detection signal output from the AND circuit 5-13 of the error detector 5 in FIG. 17. The output of the exclusive logic summing circuit 6-21 is input to the register 6-24 and the output from the register 6-24 is input to the exclusive logic summing circuit 6-25. The output of the register 6-23 is supplied to the other input of the exclusive logic summing circuit 6-25.

The output of the exclusive logic summing circuit 6-25 is fed to the register 6-26. The output of the register 6-26 is supplied to the register 6-27, and the output of the register 6-27 is input to the exclusive logic summing circuit 6-28. The other input of the exclusive logic summing circuit 6-28 is supplied by the output of the OR circuit 6-30 by way of the register 6-31.

The latched signal at the latch 6A-42 which is the xT–2T–eT pattern detection signal output from the AND circuit 11-44 of the pattern detector 11; and the 2T detection signal from the AND circuit 5-12 which is calculated with the logic sums by the AND circuit 6A-45, is supplied to the other input of the OR circuit 6-30. A 1T detection signal output from the AND circuit 5-13 of the error detection signal of FIG. 17 is supplied to the other input of the OR circuit 6-30 by way of the register 6-29.

The output from the exclusive logic summing circuit 6-28 is fed to the register 6-32 and the output of the register 6-32 is supplied to the exclusive logic summing circuit 6-33. The output from the register 6-31 is supplied to the other input of the exclusive logic summing circuit 6-33. The output from the exclusive logic summing circuit 6-33 is output by way of the register 6-34.

Next, the operation is explained. When a 3T–2T–xT pattern detect signal is output from the AND circuit 11-42, a detection signal is output by way of the latch 6A-41 and the AND circuit 6A-44. And when the register 6-23 is input by way of the OR circuit 6-22, the register 12-3 of the memory 12 outputs the data dt [3]. Accordingly, the data dt [3] is supplied to the register 6-24 as data dtout [3] by way of the exclusive logic summing circuit 6-21. At this time, the register 6-24 is held as data dtout [4] and output to the register 6-26 by way of the exclusive logic summing circuit 6-25. The contents of the registers 6-26 and 6-27 are output respectively as data dtout [5] and dtout [6]. Also, the registers 6-32 and 6-34 are output respectively as data dtout [7] and dtout [8]. When the clock pulse is input in this state, each register receives data transferred from a register in a preceding stage. In other words, the register 12-3 of the memory 12 holds and outputs the data dt [2] to the exclusive logic summing circuit 6-21, and the register 6-24 hold data dtout [3] supplied up to that time and outputs the above-mentioned data to the exclusive logic summing circuit 6-25. The register 6-26 outputs the rear flag detection signal supplied from the OR circuit 6-2, to the exclusive logic summing circuits 6-21 and 6-25. As a result, the exclusive logic summing circuit 6-21 inverts the logic level of the data dt [2] supplied from the register 12-3 and outputs the above-mentioned data as dtout [2] to the register 6-24. Also, the exclusive logic summing circuit 6-25 inverts the logic level of data dtout [3] output from the register 6-24 and outputs the above-mentioned data to the register 6-26.

When the next clock pulse is input, the register 6-26 holds and outputs to the register 6-27, the inverted logic level of the data dt [3] supplied up to that point. Also, the register 6-24 holds and outputs to the register 6-26, the inverted logic level of the data dt [2] supplied up to that point, by way of the exclusive logic summing circuit 6-25.

This data from hereon is transferred in succession to a subsequent stage and output as each clock pulse is input. In this way, when the 3T–2T–xT pattern is detected, the logic levels of the data dt [3] and dt [2] are inverted and correction processing performed.

The AND circuit 1-44 of the pattern detector 11 outputs the xT–2T–3T pattern detection signal, and when the above-mentioned detection signal is output to the register 6-31 by way of the latch 6A-42, the AND circuit 6A-45 and further the OR circuit 6-30, the data dt [6] in the register 6-27 is held and output as data dtout [6]. The register 6-32 holds and outputs the above-mentioned data as dtout [7].

When the next clock pulse is input while in this state, the register 6-27 holds the data dtout [5] supplied to this point from the register 6-26 and outputs the above-mentioned data to the exclusive logic summing circuit 6-28. The register 6-31 hold the front detection flag signal supplied from the OR circuit 6-30 and outputs the above-mentioned signal to the exclusive logic summing circuit 6-28 and the exclusive logic summing circuit 6-33. The register 6-32 holds the data dtout [6] supplied up to that point and outputs the above-mentioned data to the exclusive logic summing circuit 6-33.

Accordingly, the exclusive logic summing circuit 6-28 inverts the data dtout [5] supplied from the register 6-27 and supplies the above-mentioned data to the register 6-32. Further, the exclusive logic summing circuit 6-33 inverts the logic level of the data dtout [6] held and output by the register 6-32 and outputs the above-mentioned data to the register 6-34. The above-mentioned data is sent in sequence to the registers in the respective subsequent stages as the next clock pulse is input. In this way, inversion and correction of the data dt [6] dt [5] logic levels is performed when the xT–2T–3T pattern is detected.

On the other hand, the AND circuit 5-13 of the error detector 5 in FIG. 17, outputs the 1T detection signal and along with supplying the above-mentioned signal to the register 6-23 by means of the OR circuit 6-22, the register 12-3 of the memory 12 holds data dt [3] and outputs the above-mentioned data to the exclusive logic summing circuit 6-21 when the 1T detection signal is supplied to the register 6-29. The register 6-24 holds and outputs the data dtout [4]. In the same way, the register 6-27 outputs the data dtout [6] and the register 6-32 holds the data dtout [7].

When the next clock pulse is input while in this state, the register 6-23 holds the 1T detection signal output from the OR circuit 6-2 and outputs the above-mentioned signal to the exclusive logic summing circuit 6-21 and the exclusive logic summing circuit 6-25. Further, the register 6-24 holds the data dtout [3] supplied up to that point and outputs the above-mentioned data to the exclusive logic summing circuit 6-25. Accordingly, the exclusive logic summing circuit 6-21 inverts the logic level of data dtout [2] and supplies the above-mentioned data to the register 6-24, the exclusive logic summing circuit 6-25 inverts the logic level of data dtout [3] supplied from the register 6-24 and outputs the above-mentioned data to the register 6-26.

In the same way, the register 6-29 holds the 1T detection signal supplied from the AND circuit 5-13 and when the above-mentioned signal is output to the register 6-31 by means of the OR circuit 6-30, the register 6-27 outputs the data supplied up to that point as data dtout [5], and the register 6-32 holds and outputs the data dtout [6] supplied up to that time.

When the next clock pulse is input while in this state, the input data dtout [3] whose logic level was previously inverted is held and output by the register 6-26 while the data dtout [2] in the register 6-24 is also held and output. At this time, the register 6-31 outputs the 1T detection signal supplied from the OR circuit 6-30 to the exclusive logic summing circuits 6-28 and 6-33.

Accordingly, the exclusive logic summing circuit 6-28 inverts the logic level of data dtout [4] and supplied from the register 6-27 and outputs the above-mentioned data to the register 6-232, the exclusive logic summing circuit 6-33 inverts the logic level of data dtout [5] supplied from the register 6-32 and outputs the above-mentioned data to the register 6-34. These data are sent in sequence to the registers in the respective subsequent stages as the next clock pulse is input. In this way, inversion and correction of the data dt [5] and dt [2] logic levels is performed when the 1T error length is detected.

Figure 20:
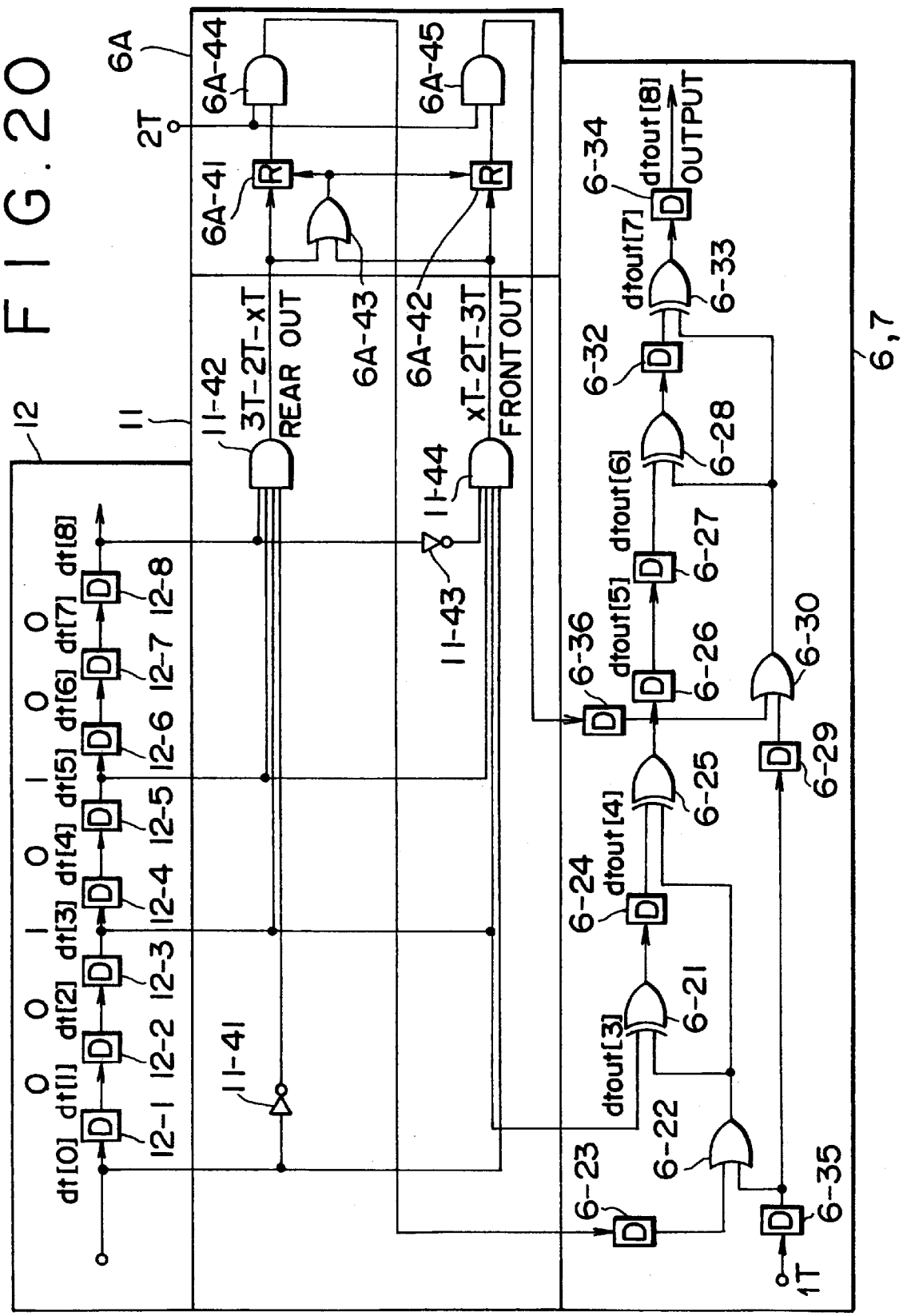
FIG. 20 is a block diagram of yet another embodiment of the correction processor circuit and correction position detector of FIG. 1.

FIG. 20 shows another embodiment of the correction processor 7 and the correction position detector 6 for processing the edge data. In this embodiment, the 3T–2T–xT detection signal output by the AND circuit 11-42 of the pattern detector 11 is summed along with the 2T detection signal input to the AND circuit 6A-44 by way of the latch 6A-41. The output from the AND circuit 6A-44 is supplied to one input of the OR circuit 6-22 by way of the register 6-23. The 1T detection signal is input by way of the register 6-35 to the other input of the OR circuit 6-22. The output of the OR circuit 6-22 is input respectively to one input of the exclusive logic summing circuits 6-21 and 6-25. The output of the register 12-3 of the memory 12 is supplied to the other input of the exclusive logic summing circuit 6-21.

The output of the exclusive logic summing circuit 6-21 is supplied by way of the register 6-24 to the other input of the exclusive logic summing circuit 6-25. The output of the exclusive logic summing circuit 6-25 is supplied to one input of the exclusive logic summing circuit 6-28 by way of the registers 6-26 and 6-27.

The xT–2T–3T detection signal output from the AND circuit 11-44 latched by the latch 6A-42 along with the logic sum of the 2T detection signal from the AND circuit 5-12 are calculated by the AND circuit 6A-45 and supplied to the other input of the exclusive logic summing circuit 6-21 by way of the register 6-36 and the OR circuit 6-30. Also, the 1T detection signal is supplied to the other input of the exclusive logic summing circuits 6-28 by way of the OR circuit 6-30 and the registers 6-35 and 6-29.

The output from the exclusive logic summing circuit 6-28 is supplied to the other input of the exclusive logic summing circuit 6-33 byway of the register 6-32. The output of the OR circuit 6-30 is supplied to the other input of the exclusive logic summing circuit 6-33. The output from the exclusive logic summing circuit 6-33 is output by way of the register 6-34.

Next this operation is described. When the AND circuit 11-42 of the pattern detector 11 outputs the 3T–2T–xt detection signal, the logic sum of this latched signal from the latch 6A-41 and the 2T detection signal from the AND circuit 5-12 are calculated by the AND circuit 6A-44. This calculated result is output to the exclusive logic summing circuits 6-21 and 6-25 by way of the OR circuit 6-22 after being held in the register 6-23. At this time, the data dt [2] from the register 12-3 is input to the other end of the exclusive logic summing circuit 6-21 so the logic level of the above-mentioned data is inverted by the exclusive logic summing circuit 6-21 and output to the register 6-24 as data dtout [2]. The register 6-24 at this time also supplies the data dtout [3] to the other input of the exclusive logic summing circuit 6-25 so that the exclusive logic summing circuit 6-25 inverts the logic level of the above-mentioned data supplying the above-mentioned data as data dtout [3] to the register 6-26. The logic of the data dt [3] and dt [2] is thus inverted and correction performed when the 3T–2T–xt pattern is detected.

When the AND circuit of the pattern detector 11 outputs the detection signal xT–2T–3T, this signal is latched by the latch 6A-42 and its logic output is summed along with the 2T detection signal from the AND circuit 5-12 by the AND circuit 6A-45. When the resulting logic sum is input to the exclusive logic summing circuits 6-28 and 6-33 by way of the register 6-26 and the OR circuit 6-30, the register 6-27 holds the data dtout [5] and the register 6-32 holds the data dtout [6]. Accordingly, the exclusive logic summing circuit 6-28 inverts the logic level of the data dtout [5] and outputs data dtout [5] to the register 6-32 while the exclusive logic summing circuit 6-33 inverts the data logic level of the data dtout [6] and outputs the above-mentioned data to the register 6-34. The logic of the data dt [6] and dt [5] is thus inverted and correction performed when the xT–2T–3t pattern is detected.

Further, when the 1T detection signal is held by the register 6-35 and input to the exclusive logic summing circuits 6-21 and 6-25 by way of the OR circuit 6-22, the register 12-3 holds the data dt [2] and the register 6-24 holds the data dtout [3]. Accordingly, the exclusive logic summing circuit 6-21 inverts the logic level of the data dtout [2] and outputs data dtout [2] to the register 6-324 while the exclusive logic summing circuit 6-25 inverts the data logic level of the data dtout [3] and outputs the above-mentioned data to the register 6-26.

When the next clock pulse is input, the register 6-29 holds the 1T detection signal supplied from the register 6-35 and outputs the above-mentioned signal to the exclusive logic summing circuit 6-28 and 6-33 by way of the OR circuit 6-30. At this time, the register 6-27 holds the data dtout [4] and the register 6-32 holds the data dtout [5].

Accordingly, the exclusive logic summing circuit 6-28 inverts the logic level of data dtout [4] and supplies the above-mentioned data to the register 6-32, while the exclusive logic summing circuit 6-33 inverts the logic level of data dtout [5] and outputs the data to the register 6-34. The logic of the data dt [5] and dt [2] is thus inverted and correction performed when the 1T detection signal is detected.

Figure 21:
FIGS. 21A through 21C show the processing in the flowchart of FIG. 16.

FIGS. 21A through 21C show examples of pattern detection and correction processing of the error detection length in the flowchart in FIG. 16. When the data dt [5] through dt [3] are "101" as shown in FIG. 21A, the data dt [4] is detected as error length 2T ((d−1)=1). When the data dt [8] through dt [5] forward of the error bit string is "1001", a continuous length of 3T (d=2) is detected. Also, when the data dt [3] through dt [0] are "1000" a continuous length of 4T((d+1)=3 at smallest is detected. This process allows the logic level of the data dt [3] and dt [2] to be inverted and correction performed when the 3T−2T−4T pattern is detected.

When the data dt [8] through dt [35 are "0001" as shown in FIG. 21B, a correction length at smallest of 4T((d+1)=3) is detected and when the data dt [3] through dt [0] is "1001" a continuous length of 3T (d=2) is detected. Therefore this allows the logic level of the data dt [6] and dt [5] to be inverted and correction performed when the 4T−2T−3T pattern is detected. Further, when the data dt [4]=dt [3]=1 as shown in FIG. 21C, the 1T ((d−2)=0) error length is detected. In this case, the logic levels of dt [5], dt [4], dt [3] and dt [2] are inverted and correction performed.

Figure 22:
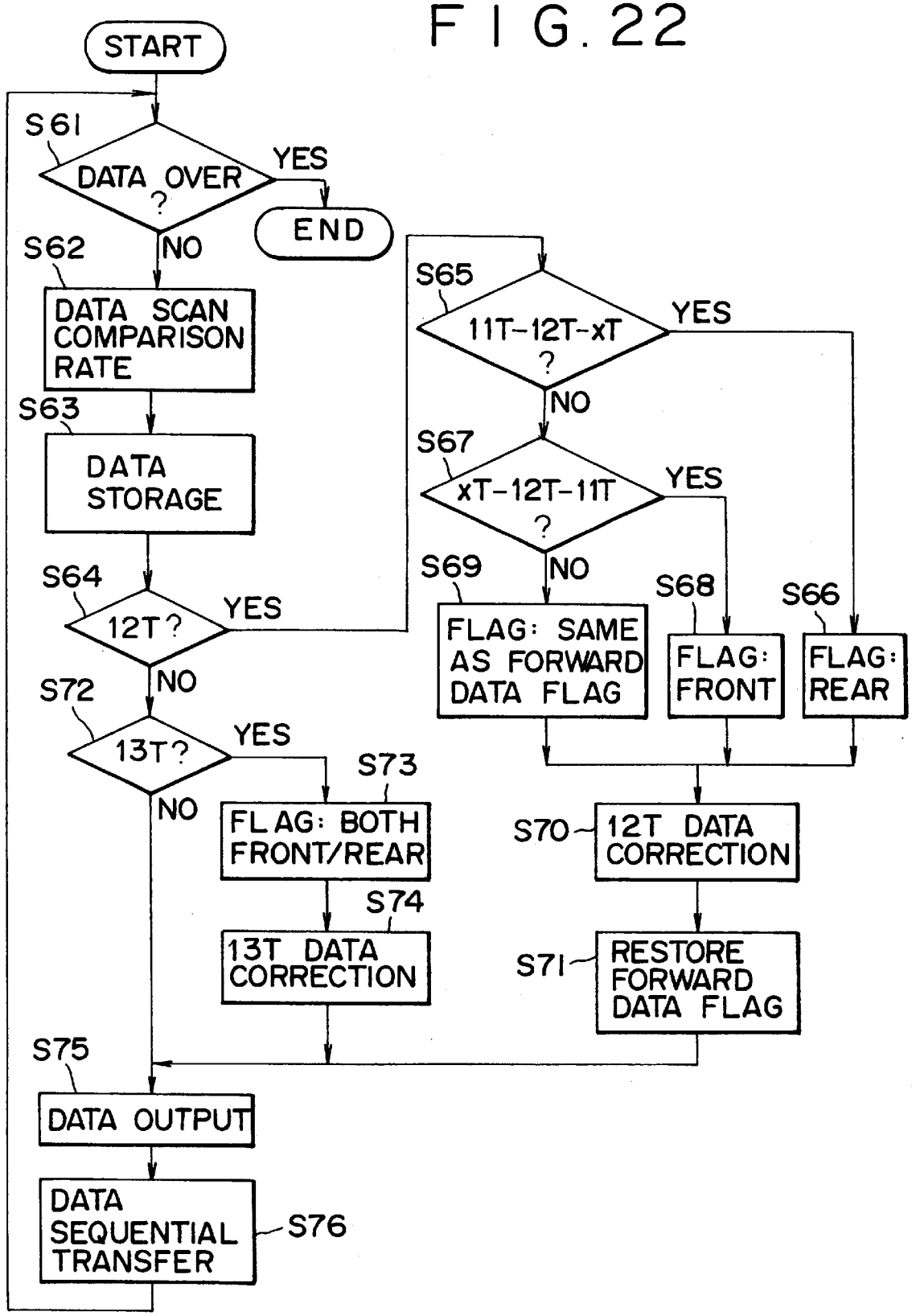
FIG. 22 is a flowchart showing correction operation of the maximum continuous length during reverse NRZI modulation in the embodiment of FIG. 1.

When reverse NRZI modulation was performed with the comparator, the correction processing of channel bit data, (k+1) for a continuous length of the same symbol larger than k is performed as shown in the flowchart in FIG. 22.

The basic process is the same as that shown in FIG. 13, but the detection process in Steps S64, S65, S67, S72 as well as the correction process Steps S70, S74 is different from the detection process in Steps S24, S25, S27, S32 and the correction process in Steps S30, S34 in FIG. 13.

More specifically, since the data has been reverse NRZI modulated as in the process of FIG. 22, detection processing of the error lengths 12T and 13T in Steps S64, S72 is performed as (k+1)=11 or (k+2)=12. Detection processing of the 11T−12T−xT pattern or the xT−12T−11T pattern in steps S65, S67 is detection processed as (k=10)−((k+1)=11)−((k−(x−9))=10−(x−9) or ((k−(x−9))=10−(x−9))−((k+1)=11)−(k=10). The correction in Steps S70, S74 is to k=10 of (k+1)=11, (k+2)=12.

In other words, when processing edge data, just as with the description comparing the process in FIG. 2 with the process in FIG. 16, the bit subject to error length or pattern detection is one bit portion smaller compared with the level data.

Figure 23:
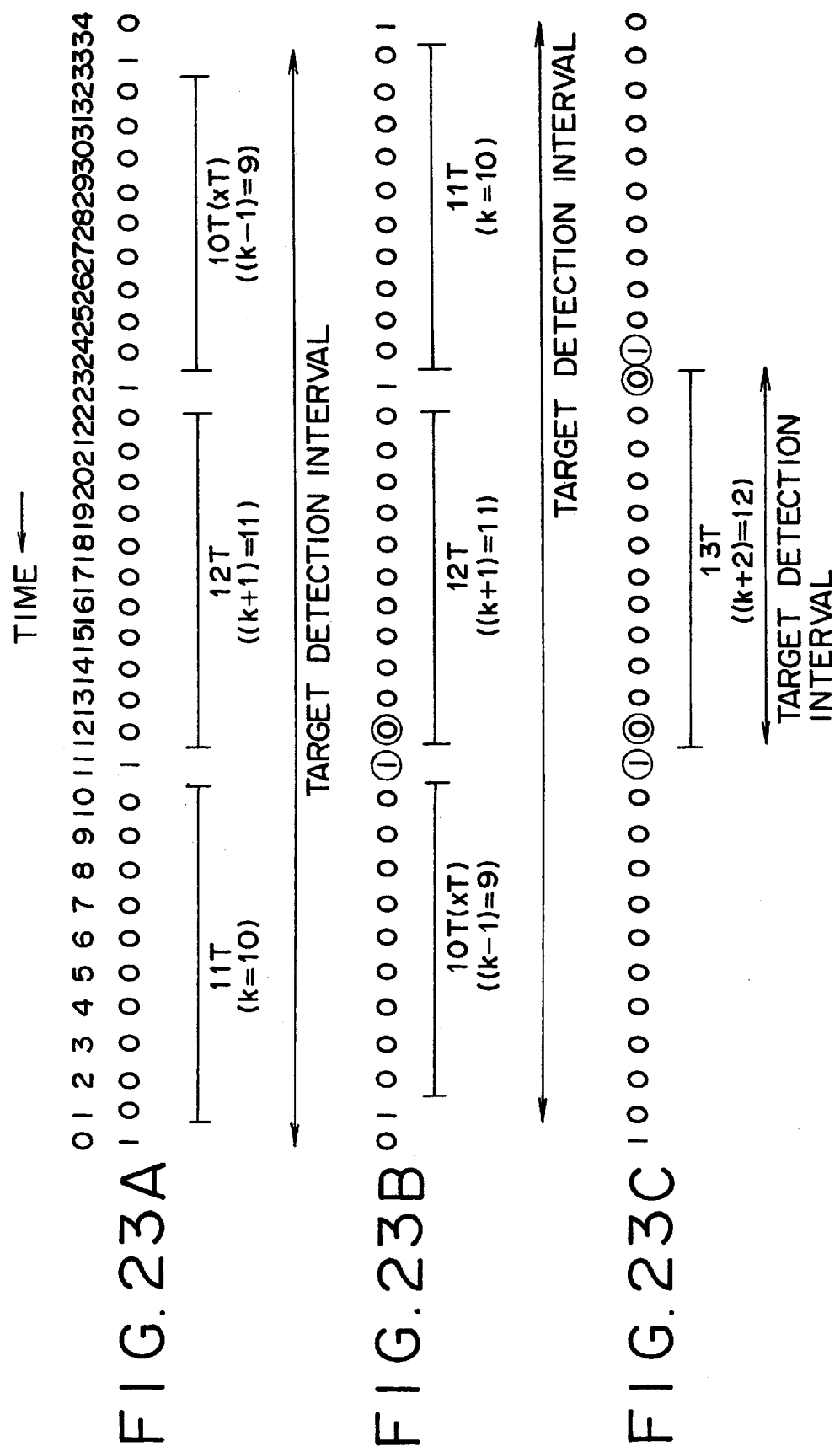
FIGS. 23A through 23C show the processing in the flowchart of FIG. 22.
Figure 24:
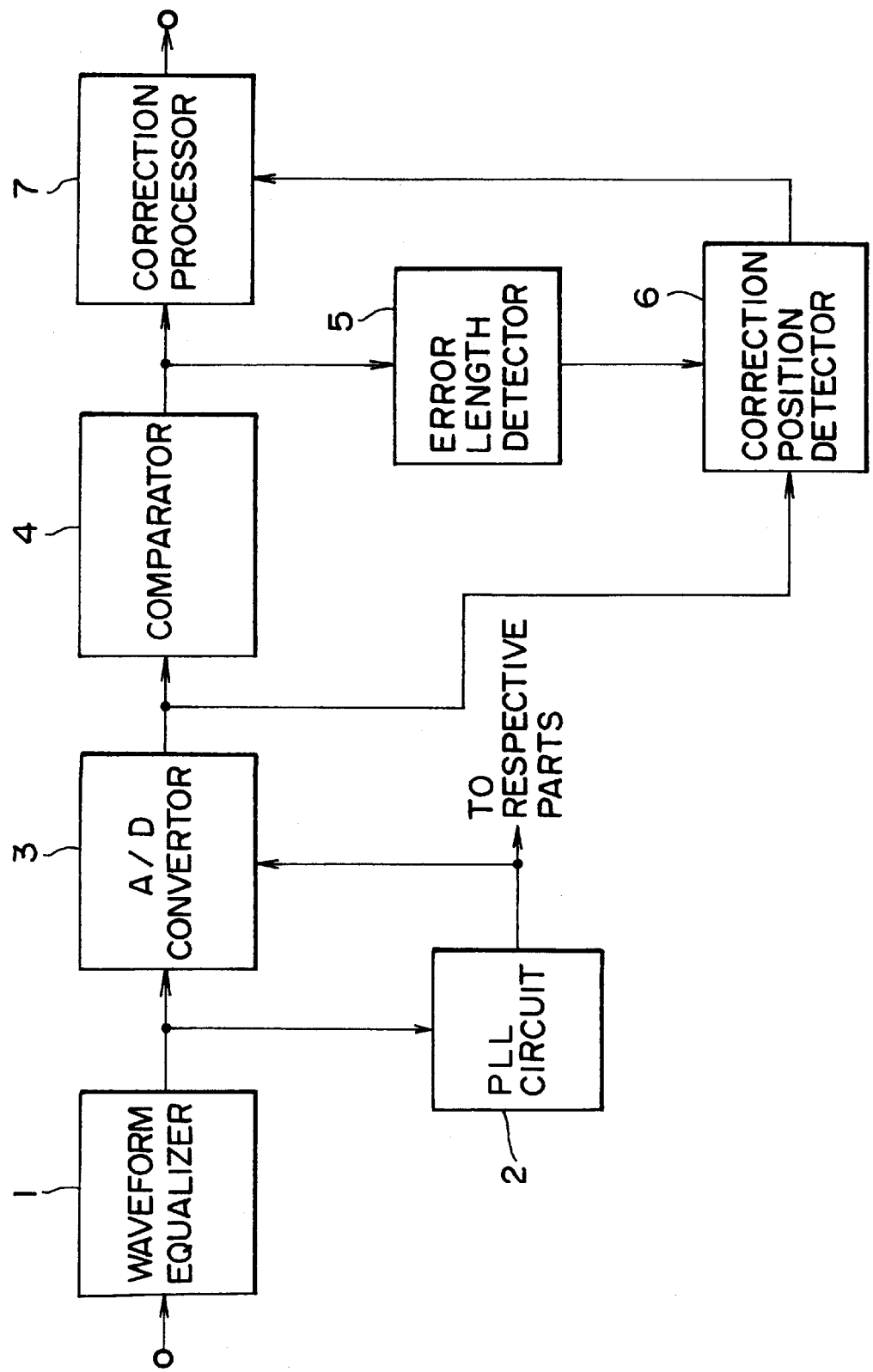
FIG. 24 is a block diagram showing an encoding and decoding device relating to this invention.

FIGS. 23A through 23C show examples of pattern detection and correction processing of the error detection length in the flowchart in FIG. 22. When the data dt [23] through dt [11] are "1000000000001" as shown in FIG. 23A, the data dt [22] through dt [12] are detected as error length 12T ((k+1)=11).

When the data dt [33] through dt [23] forward of the error bit string are other than "0000000000", a continuous length less than 10T (k−1)=9) is detected; and when the data dt [11] through dt [0] rearward of the error length is "100000000001", a continuous length of 11T (k=10) is detected. In other words, this process allows detection of patterns of Less-than10T−12T−11T. In this case the logic levels for dt [22], dt [23] are inverted and correction performed.

Further, when the data dt [34] through dt [23] forward of the error length 12T are "100000000001" as shown in FIG. 23B, a continuous length of 1T (k=10) is detected, and when the data dt [11] through dt [1] rearward of the error length is other than "10000000000", a continuous length less than 10T ((k−1)=9) is detected. Accordingly, this process allows detection of patterns of 11T−12T−less-than10T. In this case the logic levels for dt [12], dt [11] are inverted and correction performed.

Still further, when the data dt [24] through dt [11] are "1000000000001" as shown in FIG. 23C, an error length of 13T ((k+2)=12) is detected. In this case the logic levels for dt [24], dt [23] dt [12], dt [11] are inverted and correction performed.

For a minimum run d=2 in a variable length code that is a minimum length of 3T, besides EFM modulation, other systems such as EFM plus modulation or RLL (2-7) systems are available. Next results are described for tests performed based on the flowchart of FIG. 2. When the skew is zero, an optical disk whose error is zero is played back and that playback RF signal is compared with binarized data for a specified reference signal. The error that occurs when skew is applied tangentially was monitored.

With no correction processor 7 provided, and a tangential skew angle of approximately 0.47 degrees applied, the maximum bit rate error that could be corrected with the equipment was tested. When the tangential skew angle was approximately 0.47 degrees approximately 100 errors occurred. These errors were all due to mistaking 3T for 2T. When the skew angle was further increased, errors such as 3T being mistaken for 1T occurred and many errors for other pattern errors occurred. Achieving a lock in the PLL circuit became difficult when the tangential skew angle became approximately 0.66.

The following process was performed in order to find the effect of error improvement in terms of the percentage of reduced errors. In other words, when the 100 errors occurring when the correction detector 7 is not provided is expressed in percent and the 1T, 2T error correction in FIG. 2 performed, an error reduction to 2 percent was obtained when the tangential skew angle was +0.47 degrees. When the skew angle was −0.47 degrees the error was reduced to 1 percent. When the tangential skew angle was +0.66 degrees the error reduced by 47 percent and at an angle of −0.66 degrees reduced to 49%. Thus the method of this invention achieved a remarkable reduction in errors and the skew margin became larger than is known in the conventional art.

In the examples in FIGS. 7, 19 and 20, in order to make comparisons, the data dt [i] was held in the memory 12 and a dtout [7] separate from the data dt [i] held for output to the correction processor 7. The data comparison and correction was performed only once for one 2T location and only the data dt [i] was held while correction and output was performed with the identical dt [i]. In this case for instance, if data for a pattern of 3T–2T–3T–3T–4T is input and the correction position was specified at the rear, this data was converted to a 3T–3T–2T–3T–4T pattern, and next converted to a 3T–3T–3T–2T–4T pattern and further to a 3T–3T–3T–3T–3T pattern and output. Occurrence of this kind of propagation error is prone to occur when the tangential skew is large.

The inversion of the bit logic level in correction processing can also be performed by bit shift. For instance the logic levels maybe inverted in FIG. 14A by interchanging the bits dt [23] and data dt [24]. The reason is that a change causing a logic level inversion is sufficient and so the method and technique to accomplish this inversion are optional.

The recording medium for the encoding and decoding device of this invention may utilize any type of disk for recording code symbols (d, k) such as optical-magnetic disks and need not be restricted only to optical disks.

Further, the encoding and decoding device of this invention not only obtains a skew margin but is also effective in reducing the scan error in the minimum inversion period Tmin which yields improved recording line density. The recording medium itself can be considered a type of propagation path, so that this invention is well suited for decoding signals transmitted from a specified transmission path.

As explained above, the encoding and decoding device of claim 1 and the encoding and decoding method of claim 20 corrected the error length by means of the bit string pattern detection results so that so that errors can be speedily and reliably connected without having to install an A/D converter and the bit error rate can be improved at a low equipment cost.

The encoding and decoding device according claim 2 outputs a transmit symbol compared with a reference level and can simply and reliable generate a correct a transmit code symbol.

The encoding and decoding device according to claim 3 can replay a code from the recording medium for use as the transmit code symbol and in particular can increase the scan margin and defocus margin.

The encoding and decoding device according to claim 4 can easily detect a pattern by detecting at least one pattern from among the bit strings before the error string or the bit string after the error bit string.

The encoding and decoding device according to claim 5 can reliably detect the pattern by determining if the continuous length bit string before or after the error bit string is the specified length.

The encoding and decoding device according to claim 6 can correct the bits of the bit string behind the error bit string, when the bit string in front of the error bit has the specified length.

The encoding and decoding device according to claim 7 can correct the bits of the bit string in front of the error bit string, when the bit string behind the error bit has the specified length. In either of claim 6 or claim 7, the error that occurs, especially errors due to tangential skew can be reliably corrected in a simple process.

The encoding and decoding device according to claim 8 can specify the correction position with superior reliability since the correction position is temporarily stored.

The encoding and decoding device according to claim 9 can reliably perform correction processing even when the specified pattern is not detected, because a correction position is specified that corresponds to the correction position during detection just prior to the error length.

The encoding and decoding device according to claim 10 can reliably perform correction processing even when the specified pattern is not detected, because a correction position is specified that corresponds to a correction position specified beforehand.

The encoding and decoding device according to claim 11 can simply and reliably perform correction since correction is performed by inverting a logic level.

The encoding and decoding device according to claim 12 can perform reliable correction of errors in the minimum consecutive length since the identical symbol for continuous length is detected as an error length (d'–1) and corrected to the continuous length d'.

The encoding and decoding device according to claim 13 can perform reliable correction of errors in the minimum consecutive length since the bit immediately before or immediately after the error length is corrected.

The encoding and decoding device according to claim 14 can perform reliable correction of errors for a maximum continuous length of code symbol k' since the continuous length (k'+1) is detected as an error length and corrected to become a continuous length k'.

The encoding and decoding device according to claim 15 can perform reliable correction of errors for a maximum continuous length since the first bit or the last bit of the error length is corrected.

The encoding and decoding device according to claim 16 can perform reliable correction of transmit code symbols composed of edge data since an error length is detected from the transmit code symbol after reverse NRZI modulation and the identical symbol for continuous length is corrected to become d.

The encoding and decoding device according to claim 17 can perform reliable correction of errors for a maximum continuous length since the edge bit on the front side of the error length and bit in front of the edge bit; or the edge bit on the rear side of the error length and bit behind the edge bit are corrected.

The encoding and decoding device according to claim 18 can perform reliable correction of errors when NRZI modulation was performed on the code symbol for the maximum continuous length k, since the transmit code symbols comprised of edge data for the continuous length (k+1) are detected as an error length and corrected so that the continuous length becomes k.

The encoding and decoding device according to claim 19 can perform reliable correction of errors for a maximum continuous length since the edge bit on the front side of the error length and bit at the rear of the edge bit; or the edge bit on the rear side of the error length and bit in front of the edge bit are corrected.

What we claim is:

1. An encoder/decoder device for decoding a transmission code with a continuous length equal to a pre-specified length when detecting a train of code consisting of two types of symbols, in which the continuous length is a length in the identical consecutive symbols located between the other identical symbols, said encoder/decoder device has an error length detection means for detecting an error length not corresponding the pre-specified continuous length in identical symbols in said transmission code and, pattern detection means for detecting said transmission code bit string pattern containing the error bit string comprised of said error length symbols, specifier means to specify the correction position in the transmission code containing said error bit string according to the detection result of said pattern detection means and, correction means to correct said transmission code bit in the correction position specified by said specifying means so that said error length matches said specified length.

2. An encoder/decoder device of claim 1 having comparator means for comparing the signal sent by way of said transmission path with at least one reference level and outputting said transmit code.

3. An encoder/decoder device of claim 1 in which said transmit code is a code played from a specified recording medium.

4. An encoder/decoder device of claim 1 in which said pattern detection means detects at least the bit string pattern prior to said error bit string or bit string pattern after said error bit string.

5. An encoder/decoder device of claim 4 in which said pattern detection means detects whether the continuous length of the bit string before or after said error bit string matches said specified length or not.

6. An encoder/decoder device of claim 5 in which said specifier means specifies the bit string after the error bit string as the correction position, when the bit string prior to said error bit string is comprised of identical symbols of said specified length.

7. An encoder/decoder device of claim 5 in which said specifier means specifies the bit string prior to the error bit string as the correction position, when the bit string after said error bit string is comprised of identical symbols of said specified length.

8. An encoder/decoder device of claim 4 in which a storage means temporarily stores the correction position specified by the specifier means until the specification by the next specifier means.

9. An encoder/decoder device of claim 4 in which said specifier means specifies the current correction position in accordance with the correction position specified when the previous said error length was detected, in cases in which said error length is detected by said error length detection means and further, when the pattern before or after said error bit string is detected by said pattern detection means as not being the pattern specified for position correction of the bit before or after the error bit string.

10. An encoder/decoder device of claim 4 in which said specifier means specifies a pre-specified correction position from either the bit before or after said error bit string, when said error length is detected by said error length detection means and further, when the pattern before or after said error bit string is detected by said pattern detection means as not being the pattern specified for position correction of the bit before or after the error bit string.

11. An encoder/decoder device of claim 1 wherein, said correction means inverts the logic level of said bit for said correction position specified by said specifier means.

12. An encoder/decoder device of claim 1 in which said symbols are "1" and "0", said specified length is a minimum continuous length d' (=d+1 (d≧1)) of identical symbols obtained after ZRZI modulation of a minimum continuous length d being "0" placed consecutively between "1" and "1" of said code train, and said error length detection means detects a continuous length (d'−1) which is comprised of identical symbols in the channel bit string and, said correction means correct the bit string containing said error bit string so that said continuous length of said identical symbols becomes d'.

13. An encoder/decoder device of claim 12, wherein said specifier means specifies at least one of either one bit right before said error bit or one bit right after said error bit for said position correction.

14. An encoder/decoder device of claim 1 in which said symbols are "1" and "0", said specified length is a maximum continuous length k' (=k+1) of identical symbols obtained after ZRZI modulation of a maximum continuous length k being "0" placed consecutively between "1" and "1" of said code train, and said error length detection means detects a continuous length (k'−1) which is comprised of identical symbols in the channel bit string and, said correction means correct the bit string containing said error bit string so that said continuous length of said identical symbols becomes k'.

15. An encoder/decoder device of claim 14, wherein said specifier means specifies at least one of either one bit right before said error bit or one bit right after said error bit for said position correction.

16. An encoder/decoder device of claim 1, wherein said symbols are "1" and "0" and a minimum continuous length code symbol "d" is "0" placed consecutively between "1" and "1" of said code train and said specified length is continuous length d (d≧1), said error correction means detects said identical continuous length (d−1) of the channel bit string from said transmit code comprised of edge data, as said error length and, said position correction means corrects the bit string containing said error bit to become said identical continuous length symbol d.

17. An encoder/decoder device of claim 15, wherein said specifier means specifies at least one of either, an edge bit prior to said error length and its one bit right before said error length or an edge bit and one bit right after said error length for position correction.

18. An encoder/decoder device of claim 1, wherein said symbols are "1" and "0" and a maximum continuous length code symbol "k" is "0" placed consecutively between "1" and "1" of said code train and said specified length is continuous length k, said error correction means detects said identical continuous length (k+1) of the channel bit string from said transmit code comprised of edge data, as said error length and, said position correction means corrects the bit string containing said error bit to become said identical continuous length symbol k.

19. An encoder/decoder device of claim 17 wherein, said specifier means specifies at least one of either, an edge bit prior to said error length and its one bit right before said error length or an edge bit and one bit right after said error length for position correction.

20. An encoder/decoder method for decoding a transmission code sent along a specified transmission path and having a pulse train comprising two symbols with one symbol having a continuous length being a preset length in code and located between two of the other identical consecutive symbol wherein, said encoder/decoder method has an error length detection step for detecting an error length not corresponding to the specified length in identical symbols for continuous length in the transmit code and, a pattern detection step for detecting said transmit code bit string pattern containing the error bit string comprising said error length symbol, a specifier step to specify the transmit code correction position containing said error bit string that corresponds to the detection output of said pattern detection step and, a correction step to correct the position of said transmit code bit specified by said specifier step so that said error length matches said specified length.

* * * * *